United States Patent
Yoshida et al.

(10) Patent No.: US 11,723,279 B2
(45) Date of Patent: Aug. 8, 2023

(54) PIEZOELECTRIC SUBSTRATE, PIEZOELECTRIC WOVEN FABRIC, PIEZOELECTRIC KNITTED FABRIC, PIEZOELECTRIC DEVICE, FORCE SENSOR, AND ACTUATOR

(71) Applicants: MITSUI CHEMICALS, INC., Tokyo (JP); MURATA MANUFACTURING CO., LTD., Nagaokakyo (JP)

(72) Inventors: Mitsunobu Yoshida, Nagoya (JP); Kazuhiro Tanimoto, Nagoya (JP); Katsuki Onishi, Nagoya (JP); Shigeo Nishikawa, Chiba (JP); Masamichi Ando, Nagaokakyo (JP)

(73) Assignees: MITSUI CHEMICALS, INC., Tokyo (JP); MURATA MANUFACTURING CO., LTD., Nagaokakyo (JP)

( * ) Notice: Subject to any disclaimer, the term of this patent is extended or adjusted under 35 U.S.C. 154(b) by 796 days.

(21) Appl. No.: 16/307,749

(22) PCT Filed: Jun. 5, 2017

(86) PCT No.: PCT/JP2017/020886
§ 371 (c)(1),
(2) Date: Dec. 6, 2018

(87) PCT Pub. No.: WO2017/213108
PCT Pub. Date: Dec. 14, 2017

(65) Prior Publication Data
US 2019/0267538 A1     Aug. 29, 2019

(30) Foreign Application Priority Data
Jun. 6, 2016   (JP) .................................. 2016-113011

(51) Int. Cl.
*H01L 41/193* (2006.01)
*H01L 41/08* (2006.01)
(Continued)

(52) U.S. Cl.
CPC ........... *H10N 30/857* (2023.02); *C08G 63/08* (2013.01); *C08L 67/04* (2013.01); *D01F 6/625* (2013.01);
(Continued)

(58) Field of Classification Search
CPC ......... C08G 63/08; C08L 67/04; D01F 6/625; G01L 1/16; H01L 41/09; H01L 41/33;
(Continued)

(56) References Cited

U.S. PATENT DOCUMENTS 4,984,222 A   1/1991   Beauducel et al.
5,907,213 A   5/1999   Oshima et al.
(Continued)

FOREIGN PATENT DOCUMENTS

JP   H0277676 A   3/1990
JP   10132669 A   5/1998
(Continued)

OTHER PUBLICATIONS

Notice of Reasons for Rejection dated Jan. 7, 2020, by the Japanese Patent Office in corresponding Japanese Patent Application No. 2018-522490 and a partial English translation of the Notice. (10 pages).
(Continued)

*Primary Examiner* — Shawki S Ismail
*Assistant Examiner* — Monica Mata
(74) *Attorney, Agent, or Firm* — Buchanan Ingersoll & Rooney PC

(57) ABSTRACT

The present invention provides: a piezoelectric substrate which includes a first piezoelectric body having an elon-
(Continued)

gated shape and helically wound in one direction, and which does not include a core material, in which the first piezoelectric body includes a helical chiral polymer (A) having an optical activity; in which the length direction of the first piezoelectric body is substantially parallel to the main direction of orientation of the helical chiral polymer (A) included in the first piezoelectric body; and in which the first piezoelectric body has a degree of orientation F, as measured by X-ray diffraction according to the following Equation (a), within the range of 0.5 or more but less than 1.0:

degree of orientation $F=(180°-\alpha)/180°$     (a)

(in which $\alpha$ represents the half-value width of the peak derived from the orientation).

21 Claims, 3 Drawing Sheets

(51) Int. Cl.

| | | |
|---|---|---|
| H01L 41/113 | (2006.01) | |
| D01F 6/62 | (2006.01) | |
| H10N 30/857 | (2023.01) | |
| C08G 63/08 | (2006.01) | |
| C08L 67/04 | (2006.01) | |
| G01L 1/16 | (2006.01) | |
| H10N 30/08 | (2023.01) | |
| H10N 30/20 | (2023.01) | |
| H10N 30/30 | (2023.01) | |
| H10N 30/60 | (2023.01) | |
| H10N 30/072 | (2023.01) | |
| H10N 30/084 | (2023.01) | |
| H10N 30/088 | (2023.01) | |
| H10N 30/098 | (2023.01) | |
| H10N 30/00 | (2023.01) | |

(52) U.S. Cl.
CPC .............. *G01L 1/16* (2013.01); *H10N 30/072* (2023.02); *H10N 30/08* (2023.02); *H10N 30/084* (2023.02); *H10N 30/088* (2023.02); *H10N 30/098* (2023.02); *H10N 30/1061* (2023.02); *H10N 30/20* (2023.02); *H10N 30/30* (2023.02); *H10N 30/302* (2023.02); *H10N 30/60* (2023.02)

(58) Field of Classification Search
CPC ..... H01L 41/45; H01L 41/082; H01L 41/087; H01L 41/113; H01L 41/193; H01L 41/312; H01L 41/333; H01L 41/338; H01L 41/1132
USPC ........................................................ 310/330
See application file for complete search history.

(56) References Cited

U.S. PATENT DOCUMENTS

| | | | |
|---|---|---|---|
| 8,648,151 B2* | 2/2014 | Yoshida | C08G 63/08 |
| | | | 525/450 |
| 2003/0122454 A1* | 7/2003 | Omata | H01L 41/33 |
| | | | 310/367 |
| 2010/0230629 A1 | 9/2010 | Yu et al. | |
| 2012/0025674 A1 | 2/2012 | Yoshida et al. | |
| 2012/0132846 A1 | 5/2012 | Yoshida et al. | |
| 2015/0280102 A1 | 10/2015 | Tajitsu et al. | |
| 2018/0108826 A1* | 4/2018 | Tajitsu | H01L 41/082 |

FOREIGN PATENT DOCUMENTS

| | | |
|---|---|---|
| JP | 2006098062 A | 4/2006 |
| JP | 4934235 B2 | 2/2012 |
| WO | 2010022158 A2 | 2/2010 |
| WO | 2010104196 A1 | 9/2010 |
| WO | 2011089803 A1 | 7/2011 |
| WO | 2014058077 A1 | 4/2014 |

OTHER PUBLICATIONS

Extended European Search Report dated Jan. 22, 2020, by the European Patent Office in corresponding European Application No. 17810283.6. (6 pages).
Notice of Reasons for Rejection dated Jun. 30, 2020, by the Japanese Patent Office in corresponding Japanese Patent Application No. 2018-522490, and an English translation of the Notice. (5 pages).
International Search Report (PCT/ISA/210) dated Jul. 25, 2017, by the Japanese Patent Office as the International Searching Authority for International Application No. PCT/JP2017/020886.
Written Opinion (PCT/ISA/237) dated Jul. 25, 2017, by the Japanese Patent Office as the International Searching Authority for International Application No. PCT/JP2017/020886.

* cited by examiner

PIEZOELECTRIC SUBSTRATE, PIEZOELECTRIC WOVEN FABRIC, PIEZOELECTRIC KNITTED FABRIC, PIEZOELECTRIC DEVICE, FORCE SENSOR, AND ACTUATOR

TECHNICAL FIELD

The present disclosure relates to a piezoelectric substrate, a piezoelectric woven fabric, a piezoelectric knitted fabric, a piezoelectric device, a force sensor, and an actuator.

BACKGROUND ART

In recent years, the application of piezoelectric bodies including helical chiral polymers to piezoelectric devices, such as sensors and actuators, has been investigated. Such piezoelectric devices include piezoelectric bodies in the form of films.

The use of polymers having an optical activity, such as polypeptides and polylactic acid polymers, as the helical chiral polymers in the piezoelectric bodies has been drawing attention. In particular, polylactic acid polymers are known to exhibit piezoelectricity by merely being subjected to mechanical stretching. It is also known that piezoelectric bodies using polylactic acid polymers do not require a poling treatment, and that the piezoelectricity thereof does not decrease over several years.

For example, Japanese Patent (JP-B) No. 4934235 and WO 2010/104196 each discloses a piezoelectric body containing a polylactic acid polymer, which has a high piezoelectric constant $d_{14}$ and an excellent transparency.

Further, attempts have been made, in recent years, to coat conductors with materials having piezoelectricity.

For example, Japanese Patent Application Laid-Open (JP-A) No. 10-132669 discloses a piezoelectric cable including: a central conductor; a piezoelectric material layer; an outer conductor; and a casing; which are disposed coaxially, in this order, from a center toward an outer periphery of the cable.

In addition, WO 2014/058077 discloses a piezoelectric unit in which an electrically conductive fiber is covered with fibers including a piezoelectric polymer.

SUMMARY OF INVENTION

Technical Problem

In a case in which a piezoelectric body in the form of a film (such as the piezoelectric body disclosed in Examples in JP-B No. 4934235 or WO 2010/104196) is used at a site having large surface irregularities, or a site which is exposed to large deformation (for example, when used as a part or the whole of a wearable product), damage such as breakage or wrinkles may occur in the piezoelectric body due to deformation, possibly resulting in a decrease in piezoelectric sensitivity (such as, sensor sensitivity in the case of using the piezoelectric body as a sensor, or dynamic sensitivity in the case of using the piezoelectric body as an actuator; the same shall apply hereinafter).

Further, JP-A No. 10-132669 discloses the piezoelectric cable including: a central conductor; a piezoelectric material layer; an outer conductor; and a casing; which are disposed coaxially, in this order, from the center toward the outer periphery of the cable, as described above. It is also disclosed therein that polyvinylidene fluoride (PVDF) is used as the piezoelectric material. However, the piezoelectric constant of PVDF fluctuates over time, and there is a case in which the piezoelectric constant is decreased with the passing of time. In addition, PVDF has pyroelectricity due to being a ferroelectric substance, and thus, fluctuations in piezoelectric signal output could occur due to temperature changes in the surrounding environment. Accordingly, in the piezoelectric cable disclosed in JP-A No. 10-132669, stability of the piezoelectric sensitivity and stability of the piezoelectric output (stability over time) may be insufficient. Further, when a load such as repeated bending is applied to the piezoelectric cable, there is a possibility that a metal conductor portion thereof may break due to fatigue.

Further, WO 2014/058077 discloses, as the piezoelectric unit being covered with fibers including a piezoelectric polymer (hereinafter, referred to as "piezoelectric fibers"), for example, a piezoelectric unit in which piezoelectric fibers formed into a braided tube or a round braid are wound on an electrically conductive fiber. However, since the directions in which the piezoelectric fibers are wound with respect to the electrically conductive fiber are not particularly limited, in the piezoelectric unit disclosed in WO 2014/058077, in a case in which a tensile force is applied to the entire braided tube or round braid, and a shear stress thereby generated in the wound piezoelectric polymer causes electric charges to be generated in the piezoelectric polymer, the polarities of the electric charges generated in the piezoelectric polymer may cancel each other. Accordingly, the piezoelectric fibers disclosed in WO 2014/058077 may have an insufficient piezoelectric sensitivity.

The present disclosure has been done in view of the above described problems.

In other words, an object of the present disclosure is to provide a piezoelectric substrate, a piezoelectric woven fabric, a piezoelectric knitted fabric, a piezoelectric device, a force sensor, and an actuator, which have an excellent piezoelectric sensitivity, an excellent piezoelectric output stability, and an improved resistance to a load such as repeated bending or to deformation.

Solution to Problem

Specific means for achieving the above described object includes the following embodiments.

<1> A piezoelectric substrate which comprises a first piezoelectric body having an elongated shape and helically wound in one direction, and which does not comprise a core material, wherein the first piezoelectric body comprises a helical chiral polymer (A) having optical activity, wherein a length direction of the first piezoelectric body is substantially parallel to a main direction of orientation of the helical chiral polymer (A) included in the first piezoelectric body, and wherein the first piezoelectric body has a degree of orientation F, as measured by X-ray diffraction according to the following Equation (a), within a range of 0.5 or more but less than 1.0:

$$\text{degree of orientation } F=(180°-\alpha)/180° \tag{a}$$

wherein α represents a half-value width of a peak of the orientation.

<2> A piezoelectric substrate comprising:

a core material having an elongated shape; and a first piezoelectric body having an elongated shape and helically wound in one direction around the core material, wherein the core material is a non-electrically conductive core material, wherein the first piezoelectric body comprises a helical chiral polymer (A) having optical activity, wherein a length direction of the first piezoelectric body is substantially parallel to a main direction of orientation of the helical chiral polymer (A) included in the first piezoelectric body, and wherein the first piezoelectric body has a degree of orientation F, as measured by X-ray diffraction according to the following Equation (a), within a range of 0.5 or more but less than 1.0:

$$\text{degree of orientation } F=(180°-\alpha)/180° \tag{a}$$

wherein α represents a half-value width of a peak of the orientation.

<3> The piezoelectric substrate according to <1> or <2>, wherein the first piezoelectric body is in a fibrous form composed of a single bundle or a plurality of bundles, and has a major axis diameter of a cross section of from 0.0001 mm to 10 mm.

<4> The piezoelectric substrate according to <1> or <2>, wherein the first piezoelectric body is in a form of an elongated flat plate and has a thickness of from 0.001 mm to 0.2 mm and a width of from 0.1 mm to 30 mm, and wherein a ratio of the width of the first piezoelectric body to the thickness of the first piezoelectric body is 1.5 or more.

<5> The piezoelectric substrate according to any one of <1> to <4>, further comprising a fiber wound in a direction that is different from the one direction, wherein the first piezoelectric body and the fiber are alternately crossed with each other to be formed into a braided structure.

<6> The piezoelectric substrate according to any one of <1> to <4>, further comprising a second piezoelectric body having an elongated shape and wound in a direction that is different from the one direction, wherein the second piezoelectric body comprises a helical chiral polymer (A) having optical activity, wherein a length direction of the second piezoelectric body is substantially parallel to a main direction of orientation of the helical chiral polymer (A) included in the second piezoelectric body, wherein the second piezoelectric body has a degree of orientation F, as measured by X-ray diffraction according to the Equation (a), within the range of 0.5 or more but less than 1.0, wherein the first piezoelectric body and the second piezoelectric body are alternately crossed with each other to be formed into a braided structure, and wherein the helical chiral polymer (A) included in the first piezoelectric body has a chirality that is different from a chirality of the helical chiral polymer (A) included in the second piezoelectric body.

<7> The piezoelectric substrate according to any one of <1> to <6>, wherein the first piezoelectric body has a helix angle of from 10° to 80°.

<8> The piezoelectric substrate according to <2>, wherein the core material and the first piezoelectric body are twisted with each other.

<9> The piezoelectric substrate according to <8>, wherein the first piezoelectric body is in a fibrous form composed of a single bundle or a plurality of bundles, and wherein the first piezoelectric body has a major axis diameter of a cross section of from 0.0001 mm to 2 mm.

<10> The piezoelectric substrate according to any one of <1> to <9>, wherein the first piezoelectric body comprises an adhesive composition, and wherein a cured product of the adhesive composition has a tensile elastic modulus, as measured in accordance with ASTM D-882, of from 0.1 MPa to 10 GPa.

<11> The piezoelectric substrate according to any one of <1> to <10>, wherein the helical chiral polymer (A) included in the first piezoelectric body is a polylactic acid polymer having a main chain comprising a repeating unit represented by the following Formula (1):

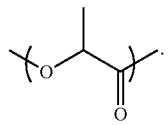

<12> The piezoelectric substrate according to any one of <1> to <11>, wherein the helical chiral polymer (A) included in the first piezoelectric body has an optical purity of 95.00% ee or more.

<13> The piezoelectric substrate according to any one of <1> to <12>, wherein the helical chiral polymer (A) included in the first piezoelectric body is composed of D-form or L-form.

<14> The piezoelectric substrate according to any one of <1> to <13>, wherein a content of the helical chiral polymer (A) included in the first piezoelectric body is 80% by mass or more with respect to a total amount of the first piezoelectric body.

<15> A piezoelectric woven fabric having a woven fabric structure composed of warp threads and weft threads, wherein at least one of the warp threads or the weft threads comprises the piezoelectric substrate according to any one of <1> to <14>.

<16> A piezoelectric woven fabric having a woven fabric structure composed of warp threads and weft threads, wherein both of the warp threads and the weft threads comprise the piezoelectric substrate according to any one of <1> to <14>, wherein the first piezoelectric body included in the warp threads is wound in a winding direction that is different from a winding direction of the first piezoelectric body included in the weft threads, and wherein the helical chiral polymer (A) included in the warp threads has a same chirality as a chirality of the helical chiral polymer (A) included in the weft threads.

<17> A piezoelectric woven fabric having a woven fabric structure composed of warp threads and weft threads, wherein both of the warp threads and the weft threads comprise the piezoelectric substrate according to any one of <1> to <14>, wherein the first piezoelectric body included in the warp threads is wound in a same winding direction as a winding direction of the first piezoelectric body included in the weft threads, and wherein the helical chiral polymer (A) included in the warp threads has a chirality that is different from a chirality of the helical chiral polymer (A) included in the weft threads.

<18> A piezoelectric knitted fabric having a knitted fabric structure comprising the piezoelectric substrate according to any one of <1> to <14>.

<19> A piezoelectric device comprising the piezoelectric woven fabric according to any one of <15> to <17>, or the piezoelectric knitted fabric according to <18>.

<20> A force sensor including the piezoelectric substrate according to any one of <1> to <14>.

<21> An actuator including the piezoelectric substrate according to any one of <1> to <14>.

Advantageous Effects of Invention

The present disclosure enables to provide a piezoelectric substrate, a piezoelectric woven fabric, a piezoelectric knitted fabric, a piezoelectric device, a force sensor, and an actuator, which have an excellent piezoelectric sensitivity, an excellent piezoelectric output stability, and an improved resistance to a load such as repeated bending or to deformation.

DESCRIPTION OF EMBODIMENTS

Figure 1:
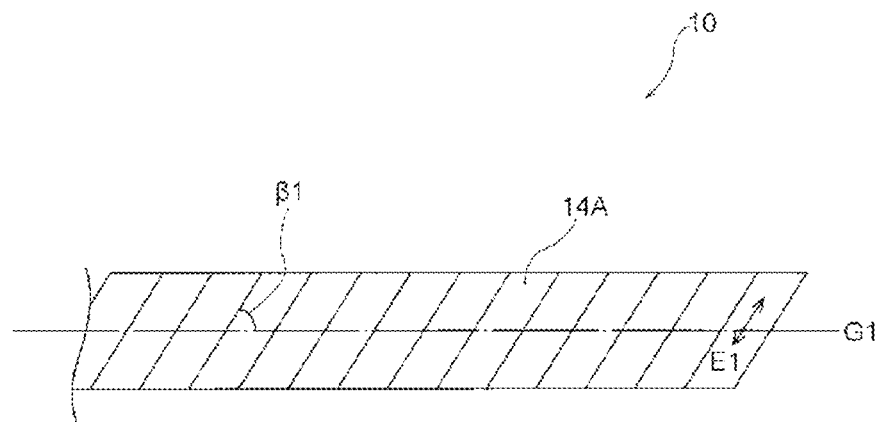
FIG. 1 is a side view showing Specific Embodiment A of a piezoelectric substrate according to a first embodiment.

The embodiments of the present disclosure will now be described.

In the present specification, any numerical range indicated using an expression "from * to" represents a range in which numerical values described before and after the "to" are included in the range as a minimum value and a maximum value, respectively. In a numerical range described in stages, in the present specification, a lower limit value or an upper limit value described in a certain numerical range may be replaced with an upper limit value or a lower limit value in another numerical range described in stages. Further, in a numerical range described in the present disclosure, an upper limit value or a lower limit value described in a certain numerical range may be replaced with a value shown in Examples.

In the present specification, the term "main surface" of a piezoelectric body in the form of an elongated flat plate (a first piezoelectric body or a second piezoelectric body), refers to each of both surfaces orthogonal to a thickness direction of the piezoelectric body in the form of an elongated flat plate (namely, a surface including the length direction and width direction). The same applies to the "main surface" of a woven fabric or the "main surface" of a knitted fabric.

In the present specification, the term "surface" of a member refers to the "main surface" of the member, unless otherwise specified.

In the present specification, the thickness, width, and length satisfy the relation: thickness<width<length, as commonly defined.

In the present specification, an angle formed between two line segments is described in a range of from 0° to 90°.

In the present specification, the term "film" is used as a concept which encompasses not only one generally referred to as a "film", but also one generally referred to as a "sheet".

In the present specification, the term "MD direction" refers to the direction of film flow (Machine Direction), namely a stretching direction, and the term "TD direction" refers to the direction orthogonal to the MD direction and parallel to the main surface of the film (Transverse Direction).

The first embodiment of the piezoelectric substrate according to the present disclosure will now be described in detail.

[Piezoelectric Substrate according to First Embodiment]

The piezoelectric substrate according to the first embodiment includes a first piezoelectric body having an elongated shape and helically wound in one direction, and does not include a core material.

In other words, in the piezoelectric substrate according to the first embodiment, the first piezoelectric body is helically wound in one direction with respect to a virtual helical axis, and not with respect to a core material.

The term "helical axis" refers to a central axis of a helical structure formed by the first piezoelectric body.

Further, the piezoelectric substrate according to the first embodiment is a piezoelectric substrate wherein the first piezoelectric body includes a helical chiral polymer (A) having an optical activity, wherein the length direction of the first piezoelectric body is substantially parallel to the main direction of orientation of the helical chiral polymer (A) included in the first piezoelectric body, and wherein the first piezoelectric body has a degree of orientation F, as measured by X-ray diffraction according to the following Equation (a), within the range of 0.5 or more but less than 1.0.

$$\text{Degree of orientation } F=(180-\alpha)/180° \tag{a}$$

In the Equation (a), $\alpha$ represents the half-value width of the peak derived from the orientation. The unit of $\alpha$ is "° (degree(s))".

In the description of the piezoelectric substrate according to the first embodiment given below, the "first piezoelectric body having an elongated shape" is sometimes simply referred to as the "first piezoelectric body". Further, the "virtual helical axis" is sometimes simply referred to as the "helical axis".

Examples of the embodiment of the piezoelectric substrate which does not include a core material include: an embodiment in which no space (gap), or substantially no space, is present around the helical axis, in the helical structure formed by the first piezoelectric body; and an embodiment in which a predetermined space is present around the helical axis.

The size of the space present around the helical axis can be adjusted, for example, by: a method in which the winding method of the first piezoelectric body is adjusted; a method in which the first piezoelectric body is wound around a fiber which is soluble by a specific action (such as a thread soluble in water), under the above described conditions, followed by allowing the fiber to dissolve over time, or dissolving and removing the fiber with water; or a method in which the first piezoelectric body is wound around a core material, followed by removing the core material. The major axis diameter of the fiber or the major axis diameter of the core material can be selected as appropriate depending on the embodiment of the space. In a case in which the first piezoelectric body is in the form of an elongated flat plate, the space around the helical axis can be controlled by increasing or decreasing the number of windings per 1 m of the first piezoelectric body.

The degree of orientation F of the first piezoelectric body is an index indicating the degree of orientation of the helical chiral polymer (A) included in the first piezoelectric body, and is, for example, a c-axis orientation degree as measured by a wide-angle x-ray diffraction apparatus (RINT 2550, manufactured by Rigaku Corporation; accessory device: rotary sample stand, X-ray source: CuKα, output: 40 kV 370 mA, detector: scintillation counter).

Examples of the method of measuring the degree of orientation F of the first piezoelectric body are as shown in the Examples to be described later.

The term "one direction" refers, when the piezoelectric substrate according to the first embodiment is seen from one end side of the helical axis, to the direction in which the first piezoelectric body is wound from the near side to the far side. Specifically, the term "one direction" refers to a rightward direction (wound in a right-handed direction, namely, in the clockwise direction), or a leftward direction (wound in a left-handed direction, namely, in the anti-clockwise direction).

By having the above configuration, the piezoelectric substrate according to the first embodiment has an excellent piezoelectric sensitivity, an excellent piezoelectric output stability, and an improved resistance to a load such as repeated bending or to deformation.

More specifically, the piezoelectric substrate according to the first embodiment exhibits piezoelectricity due to the facts that: the first piezoelectric body includes the helical chiral polymer (A); the length direction of the first piezoelectric body is substantially parallel to the main direction of orientation of the helical chiral polymer (A); and the degree of orientation F of the first piezoelectric body is 0.5 or more but less than 1.0.

Further, in the piezoelectric substrate according to the first embodiment, the disposition of the first piezoelectric body in the above described arrangement allows a shear force to be applied to the helical chiral polymer (A), when a tensile force (stress) is applied in the length direction of the piezoelectric substrate. As a result, the polarization of the helical chiral polymer (A) occurs in a radial direction of the piezoelectric substrate. In a case in which the helically wound, first piezoelectric body is regarded as an aggregate of micro-regions which can be roughly considered as a plain in the length direction of the piezoelectric body, and when the shear force generated due to the tensile force (stress) in the plain composed of the micro-regions is applied to the helical chiral polymer, the direction of the polarization roughly matches the direction of an electric field generated due to a piezoelectric stress constant $d_{14}$.

Specifically, for example, in the case of polylactic acid, such as, in the case of a homopolymer of an L-lactic acid (PLLA) having a molecular structure in the form of a left-handed helix, when the first piezoelectric body in which the main direction of orientation of PLLA is substantially parallel to the length direction of the piezoelectric body is helically wound in the left-handed direction with respect to the helical axis to obtain a structure, and when a tensile force (stress) is applied to the structure, an outward electric field (polarization) is generated in a direction parallel to the radial direction, from the center of a circle of a circular cross section vertical to the tensile force. Conversely, when the first piezoelectric body in which the main direction of orientation of PLLA is substantially parallel to the length direction of the piezoelectric body is helically wound in the right-handed direction with respect to the helical axis to obtain a structure, and when a tensile force (stress) is applied to the structure, an inward electric field (polarization) is generated in the direction parallel to the radial direction, from the outer periphery of the circle of the circular cross section vertical to the tensile force.

Further, for example, in the case of homopolymer of a D-lactic acid (PDLA) having a molecular structure in the form of a right-handed helix, when the first piezoelectric body in which the main direction of orientation of PDLA is substantially parallel to the length direction of the piezoelectric body is helically wound in the left-handed direction with respect to the helical axis to obtain a structure, and when a tensile force (stress) is applied to the structure, an inward electric field (polarization) is generated in the direction parallel to the radial direction, from the outer periphery of the circle of the circular cross section vertical to the tensile force. Conversely, when the first piezoelectric body in which the main direction of orientation of PDLA is substantially parallel to the length direction of the piezoelectric body is helically wound in the right-handed direction with respect to the helical axis to obtain a structure, and when a tensile force (stress) is applied to the structure, an outward electric field (polarization) is generated in the direction parallel to the radial direction, from the center of the circle of the circular cross section vertical to the tensile force.

As a result, when a tensile force is applied in the length direction of the piezoelectric substrate, a potential difference proportional to the tensile force is generated at respective portions of the helically disposed first piezoelectric body, in a phase matched manner, and this is thought to allow for an effective detection of a voltage signal proportional to the tensile force.

Therefore, the piezoelectric substrate according to the first embodiment has an excellent piezoelectric sensitivity as well as excellent piezoelectric output stability.

Further, the piezoelectric substrate according to the first embodiment has an excellent bendability and flexibility (ductility), due to including no core material.

Therefore, the piezoelectric substrate according to the first embodiment has an improved resistance to a load such as repeated bending or to deformation.

In particular, in a piezoelectric substrate in which a non-pyroelectric polylactic acid polymer is used as the helical chiral polymer (A), the stability of the piezoelectric sensitivity and the stability of the piezoelectric output (stability over time) are further improved as compared to a piezoelectric substrate in which a pyroelectric PVDF is used.

In the piezoelectric unit including the piezoelectric fiber disclosed in the previously described WO 2014/058077, the winding directions of the piezoelectric fibers with respect to the electrically conductive fiber are not limited, and in addition, the origin and the direction of a force as a component of the shear force are different from those of the piezoelectric substrate according to the first embodiment, and the piezoelectric substrate according to the second embodiment to be described later. Accordingly, the application of a tensile force to the piezoelectric unit disclosed in WO 2014/058077 does not induce polarization in the radial direction of the piezoelectric unit; in other words, polarization does not occur in the direction of the electric field generated due to the piezoelectric stress constant $d_{14}$. This is thought to result in an insufficient piezoelectric sensitivity.

It is to be noted here that the fact that the length direction of the first piezoelectric body is substantially parallel to the main direction of orientation of the helical chiral polymer (A), provides an advantage that the first piezoelectric body has a high resistance against tension in the length direction (namely, the piezoelectric body has an excellent tensile strength in the length direction). This makes the first piezoelectric body less susceptible to rupture even when the piezoelectric body is helically wound in one direction with respect to the helical axis.

Further, the fact that the length direction of the first piezoelectric body is substantially parallel to the main direction of orientation of the helical chiral polymer (A) is also advantageous, for example, from the viewpoint of productivity in the case of slitting a stretched piezoelectric film to obtain the first piezoelectric body (such as a slit ribbon).

In the present specification, the expression "substantially parallel" means that the angle formed between two line segments is 0° or more but less than 30° (preferably from 0° to 22.5°, more preferably from 0° to 10°, still more preferably from 0° to 5°, and particularly preferably from 0° to 3°).

Further, in the present specification, the "main direction of orientation of the helical chiral polymer (A)" refers to the direction in which molecules of the helical chiral polymer (A) are mainly oriented. The main direction of orientation of the helical chiral polymer (A) can be confirmed by measuring the degree of orientation F of the first piezoelectric body.

In a case in which the first piezoelectric body is produced by melt spinning raw materials, followed by stretching the resultant, the main direction of orientation of the helical chiral polymer (A) in the thus produced first piezoelectric body refers to a main stretching direction. The main stretching direction refers to the stretching direction.

In the same manner, in a case in which the first piezoelectric body is produced by stretching a film and slitting the stretched sheet to form a slit, the main direction of orientation of the helical chiral polymer (A) in the thus produced first piezoelectric body refers to the main stretching direction. The main stretching direction as used herein refers to the stretching direction, in the case of uniaxial stretching; and refers to a stretching direction having a higher draw ratio, in the case of biaxial stretching.

Preferred embodiments of the piezoelectric substrate according to the first embodiment will be described below.

In the piezoelectric substrate according to the first embodiment, it is preferred that the first piezoelectric body is in a fibrous form composed of a single bundle or a plurality of bundles, and the major axis diameter of a cross section of the first piezoelectric body is from 0.0001 mm to 10 mm, more preferably from 0.001 mm to 5 mm, and still more preferably from 0.002 mm to 1 mm, from the viewpoint of improving the piezoelectric sensitivity, and the piezoelectric output stability.

In a case in which a cross section of the first piezoelectric body (preferably, a fibrous piezoelectric body) has a circular shape, the "major axis diameter of a cross section" as used herein refers to the "diameter" of the first piezoelectric body.

In a case in which a cross section of the first piezoelectric body has a deformed shape, the "major axis diameter of a cross section" refers to the longest width among the widths of the cross section.

In a case in which the first piezoelectric body is composed of a plurality of bundles, the "major axis diameter of a cross section" refers to the major axis diameter of a cross section of the piezoelectric body composed of a plurality of bundles.

It the piezoelectric substrate according to the first embodiment, the first piezoelectric body is preferably in the form of an elongated flat plate, from the viewpoint of improving the piezoelectric sensitivity, and the piezoelectric output stability.

Further, it is preferred that the thickness of the first piezoelectric body is from 0.001 mm to 0.2 mm, the width of the first piezoelectric body is from 0.1 mm to 30 mm, and the ratio of the width of the first piezoelectric body to the thickness of the first piezoelectric body is 1.5 or more.

A more detailed description will be given below regarding the size (thickness, width, ratio (width/thickness, length/width)) of the first piezoelectric body in the form of an elongated flat plate (hereinafter, also referred to as an "elongated flat plate-like piezoelectric body").

The thickness of the first piezoelectric body is preferably from 0.001 mm to 0.2 mm.

When the thickness is 0.001 mm or more, the strength of the elongated flat plate-like piezoelectric body can be secured. Further, the elongated flat plate-like piezoelectric body has an excellent production suitability.

When the thickness is 0.2 mm or less, on the other hand, the degree of freedom of deformation (flexibility) of the elongated flat plate-like piezoelectric body in the thickness direction is improved.

The width of the first piezoelectric body is preferably from 0.1 mm to 30 mm.

When the width is 0.1 mm or more, the strength of the first piezoelectric body (elongated flat plate-like piezoelectric body) can be secured. Further, the elongated flat plate-like piezoelectric body has an excellent production suitability (for example, excellent production suitability in a slitting step to be described later).

When the width is 30 mm or less, on the other hand, the degree of freedom of deformation (flexibility) of the elongated flat plate-like piezoelectric body is improved.

The ratio of the width of the first piezoelectric body to the thickness of the first piezoelectric body (hereinafter, also referred to as the "ratio [width/thickness]") is preferably 1.5 or more.

When the ratio [width/thickness] is 1.5 or more, the main surfaces of the piezoelectric body become evident, and this facilitates the formation of a charge generation layer oriented along the length direction of the first piezoelectric body (elongated flat plate-like piezoelectric body). Further, when the elongated flat plate-like piezoelectric body is formed into a piezoelectric woven fabric or a piezoelectric knitted fabric to be described later, for example, the electric charge generation layers can be easily oriented on the main surfaces of the resulting piezoelectric woven fabric or piezoelectric knitted fabric. As a result, a piezoelectric device (such as a piezoelectric woven fabric or a piezoelectric knitted fabric) which has an excellent piezoelectric sensitivity upon measuring a surface potential by a non-contact surface potentiometer or the like, and which also has an excellent stability of the piezoelectric sensitivity, is more easily obtained.

The width of the first piezoelectric body is more preferably from 0.5 mm to 15 mm.

When the width is 0.5 mm or more, the strength of the first piezoelectric body (elongated flat plate-like piezoelectric body) is further improved. In addition, the twisting of the elongated flat plate-like piezoelectric body can be further prevented, thereby further improving the piezoelectric sensitivity and the stability thereof.

When the width is 15 mm or less, the degree of freedom of deformation (flexibility) of the elongated flat plate-like piezoelectric body is further improved.

In the first piezoelectric body, the ratio of the length to the width (hereinafter, also referred to as the ratio [length/width]) is preferably 10 or more.

When the ratio [length/width] is 10 or more, the degree of freedom of deformation (flexibility) of the first piezoelectric body (elongated flat plate-like piezoelectric body) is further improved. In addition, it becomes possible to impart piezoelectricity over a wider area, in a piezoelectric device (such as a piezoelectric woven fabric or a piezoelectric knitted fabric) in which the elongated flat plate-like piezoelectric body is used.

In the piezoelectric substrate according to the first embodiment, it is preferred that the piezoelectric substrate further includes a fiber wound in a direction different from the one direction, and that the first piezoelectric body and the fiber are alternately crossed with each other to be formed into a braided structure.

This arrangement allows a state in which the first piezoelectric body is wound in one direction with respect to the helical axis, to be more easily retained, when the piezoelectric substrate is bent and deformed. As a result, polarization is more likely to occur in the helical chiral polymer (A) included in the first piezoelectric body, when a tensile force is applied in the length direction of the piezoelectric substrate. Note that, in the braided structure of this embodiment, it is preferred that there is no gap between the first piezoelectric body and the fiber, in order to allow for a more efficient application of a tensile force to the first piezoelectric body.

In the piezoelectric substrate according to the first embodiment, it is preferred that:

the piezoelectric substrate further includes a second piezoelectric body having an elongated shape and wound in a direction different from the one direction;

the second piezoelectric body includes a helical chiral polymer (A) having an optical activity;

the length direction of the second piezoelectric body is substantially parallel to the main direction of orientation of the helical chiral polymer (A) included in the second piezoelectric body;

the second piezoelectric body has a degree of orientation F, as measured by X-ray diffraction according to the Equation (a), within the range of 0.5 or more but less than 1.0;

the first piezoelectric body and the second piezoelectric body are alternately crossed with each other to be formed into a braided structure; and the helical chiral polymer (A) included in the first piezoelectric body has a chirality different from the chirality of the helical chiral polymer (A) included in the second piezoelectric body.

By this arrangement, polarization occurs in both the helical chiral polymer (A) included in the first piezoelectric body and the helical chiral polymer (A) included in the second piezoelectric body, when a tensile force is applied in the length direction of the piezoelectric substrate, for example. The polarization of each of the helical chiral polymers (A) occurs in the radial direction of the piezoelectric substrate.

This allows for a more effective detection of the voltage signal proportional to the tensile force. As a result, the piezoelectric sensitivity, and the piezoelectric output stability are further improved.

Further, the piezoelectric substrate according to the first embodiment is a piezoelectric substrate having an excellent bendability and flexibility (ductility) due to including no core material, as described above.

In addition, in a case in which the piezoelectric substrate according to the first embodiment includes the first piezoelectric body and the second piezoelectric body which are formed into a braided structure, adequate gaps are formed between the first piezoelectric body and second piezoelectric body. As a result, when a force which causes the piezoelectric substrate to be bent and deformed is applied thereto, the gaps absorb the deformation, allowing the piezoelectric substrate to be flexibly bent and deformed.

Accordingly, the piezoelectric substrate according to the first embodiment can be suitably used as a constituent member in a product which needs to conform to a three-dimensional plane, for example, a wearable product (such as a piezoelectric woven fabric, a piezoelectric knitted fabric, a piezoelectric device, a force sensor, or a device for obtaining biological information, to be described later).

In the piezoelectric substrate according to the first embodiment, it is preferred that the first piezoelectric body has a helix angle of from 10° to 80° (45°±35°), more preferably from 15° to 75° (45°±30°), and still more preferably from 35° to 65° (45°±10°), from the viewpoint of improving the piezoelectric sensitivity, and the piezoelectric output stability.

The term "helix angle" refers to the angle formed between the helical axis and an arrangement direction of the first piezoelectric body with respect to the helical axis.

In the piezoelectric substrate according to the first embodiment, it is preferred that:

the first piezoelectric body includes an adhesive composition, and a cured product of the adhesive composition has a tensile elastic modulus, as measured in accordance with ASTM D-882, of from 0.1 MPa to 10 GPa, more preferably from 0.1 MPa to 5 GPa, and still more preferably from 0.1 MPa to 3 GPa.

This arrangement allows adjacent portions of the first piezoelectric body to be adhered with each other by the adhesive composition (adhesive), and makes the relative positions of the portions of the first piezoelectric body less likely to be displaced. Consequently, a tensile force is more efficiently applied to the first piezoelectric body, allowing a shear stress to be more effectively applied to the helical chiral polymer (A) included in the first piezoelectric body. As a result, a voltage signal (electric charge signal) proportional to the tensile force can be effectively detected.

When the tensile elastic modulus of the cured product of the adhesive is 0.1 MPa or more, a strain (piezoelectric strain) caused by the tensile force applied to the piezoelectric substrate according to the first embodiment is less likely to be alleviated at adhesive portions, as a result of which the efficiency of transmitting the strain to the first piezoelectric body is enhanced.

Accordingly, the piezoelectric sensitivity, and the piezoelectric output stability are further improved.

The tensile elastic modulus after bonding, of the adhesive in the first embodiment, namely, the tensile elastic modulus of the cured product of the adhesive, is preferably about equal to or greater than the tensile elastic modulus of the first piezoelectric body.

The method of measuring the tensile elastic modulus of the cured product of the adhesive composition will be described in detail in the Examples.

In the piezoelectric substrate according to the first embodiment, the helical chiral polymer (A) included in the first piezoelectric body is preferably a polylactic acid polymer having a main chain including a repeating unit represented by the following Formula (1), from the viewpoint of further improving the piezoelectricity.

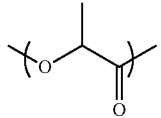

(1)

In the piezoelectric substrate according to the first embodiment, the helical chiral polymer (A) included in the first piezoelectric body preferably has an optical purity of 95.00% ee or more, from the viewpoint of further improving the piezoelectricity.

In the piezoelectric substrate according to the first embodiment, the helical chiral polymer (A) included in the first piezoelectric body is preferably composed of D-form or L-form from the viewpoint of further improving the piezoelectricity.

In the piezoelectric substrate according to the first embodiment, the content of the helical chiral polymer (A) included in the first piezoelectric body is preferably 80% by mass or more with respect to the total amount of the first piezoelectric body, from the viewpoint of further improving the piezoelectricity.

Specific Embodiment A of the piezoelectric substrate according to the first embodiment will be described below, with reference to the drawings.

Specific Embodiment A

FIG. 1 is a side view showing Specific Embodiment A of the piezoelectric substrate according to the first embodiment.

As shown in FIG. 1, a piezoelectric substrate 10 of Specific Embodiment A includes a first piezoelectric body 14A having an elongated shape, and does not include a core material.

The first piezoelectric body 14A is helically wound in one direction with respect to a helical axis G1 at a helix angle β1, from one end to the other, such that no gap is formed and no space is present around the helical axis G1. Further, the first piezoelectric body 14A is impregnated with an adhesive (not shown in the figure), and adjacent portions of the first piezoelectric body 14A are adhered with each other by the adhesive.

The "helix angle β1" refers to the angle formed between the helical axis G1, and the arrangement direction of the first piezoelectric body 14A with respect to the helical axis G1.

Further, in Specific Embodiment A, the first piezoelectric body 14A is wound in the left-handed direction with respect to the helical axis G1. Specifically, when the piezoelectric substrate 10 is seen from one end side of the helical axis G1 (on the right side, in the case of FIG. 1), the first piezoelectric body 14A is wound in the left-handed direction, from the near side to the far side.

Further, in FIG. 1, the main direction of orientation of the helical chiral polymer (A) included in the first piezoelectric body 14A is shown with a two-way arrow E1. In other words, the main direction of orientation of the helical chiral polymer (A) is substantially parallel to the arrangement direction (the length direction of the first piezoelectric body 14A) of the first piezoelectric body 14A.

The functions of the piezoelectric substrate 10 of Specific Embodiment A will be described below.

For example, when a tensile force is applied in the length direction of the piezoelectric substrate 10, a shear force is applied to the helical chiral polymer (A) included in the first piezoelectric body 14A, and polarization occurs in the helical chiral polymer (A). The polarization of the helical chiral polymer (A) occurs in the radial direction of the piezoelectric substrate 10, and it is thought that the polarization occurs in that direction in a phase matched manner. This allows for an effective detection of a voltage signal proportional to the tensile force.

Further, in the piezoelectric substrate 10, since the first piezoelectric body 14A is impregnated with an adhesive (not shown in the figure), as described above, the relative positions of the portions of the first piezoelectric body 14A are less likely to be displaced, allowing a tensile force to be more effectively applied to the first piezoelectric body 14A.

In addition, the piezoelectric substrate 10 has an excellent bendability and flexibility, due to including no core material.

The above described arrangements allow the piezoelectric substrate 10 of Specific Embodiment A to have an excellent piezoelectric sensitivity, an excellent piezoelectric output stability, and an improved resistance to a load such as repeated bending or to deformation.

Next, Specific Embodiments B1 and B2 of the piezoelectric substrates according to the first embodiment will be described with reference to the drawings. In the description given below, the repetition of the description given in Specific Embodiment A will be omitted.

Specific Embodiment B1

Figure 2:
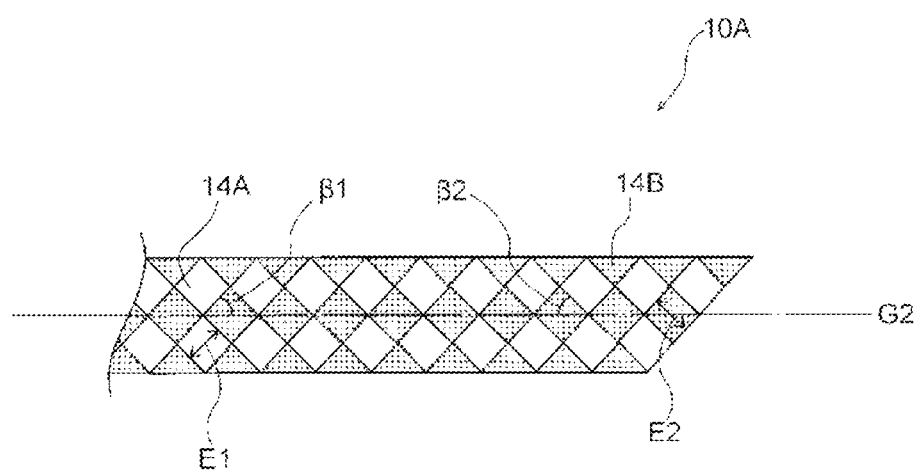
FIG. 2 is a side view showing Specific Embodiment B of the piezoelectric substrate according to the first embodiment.

FIG. 2 is a side view showing Specific Embodiment B1 of the piezoelectric substrate according to the first embodiment.

A piezoelectric substrate 10A of Specific Embodiment B1 includes the first piezoelectric body 14A, and a second piezoelectric body 14B, and does not include a core material. The first piezoelectric body 14A and the second piezoelectric body 14B are alternately crossed with each other to be formed into a braided structure.

The helical chiral polymer (A) included in the first piezoelectric body 14A has a chirality different from the chirality of the helical chiral polymer (A) included in the second piezoelectric body 14B.

As shown in FIG. 2, in the piezoelectric substrate 10A of Specific Embodiment B1, the first piezoelectric body 14A is helically wound in the left-handed direction with respect to a helical axis G2 at the helix angle β1, and the second piezoelectric body 14B is helically wound in the right-handed direction at a helix angle β2, and in addition, the first piezoelectric body 14A and the second piezoelectric body 14B are alternately crossed with each other.

Further, in the braided structure shown in FIG. 2, the main direction of orientation (two-way arrow E1) of the helical chiral polymer (A) included in the first piezoelectric body 14A is substantially parallel to the arrangement direction of the first piezoelectric body 14A. In the same manner, the main direction of orientation (two-way arrow E2) of the helical chiral polymer (A) included in the second piezoelectric body 14B is substantially parallel to the arrangement direction of the second piezoelectric body 14B.

The functions of the piezoelectric substrate 10A of Specific Embodiment B1 will be described below.

For example, when a tensile force is applied in the length direction of the piezoelectric substrate 10A, polarization occurs in both the helical chiral polymer (A) included in the first piezoelectric body 14A, and the helical chiral polymer (A) included in the second piezoelectric body 14B. The polarization of each of the helical chiral polymers (A) occurs in the radial direction of the piezoelectric substrate 10A. This allows for an effective detection of a voltage signal proportional to the tensile force.

Further, the piezoelectric substrate 10A has an excellent bendability and flexibility, due to having a braided structure with no core material.

The above described arrangements allow the piezoelectric substrate 10A of Specific Embodiment B1 to have an excellent piezoelectric sensitivity, an excellent piezoelectric output stability, and an improved resistance to a load such as repeated bending or to deformation.

In particular, in the piezoelectric substrate 10A of Specific Embodiment B1, when a tensile force is applied to the length direction of the piezoelectric substrate 10A, a shear stress is applied to the first piezoelectric body 14A wound in the left-handed direction and the second piezoelectric body 14B wound in the right-handed direction, which are formed into the braided structure, and the direction of polarization in the first piezoelectric body 14A matches the direction of polarization in the second piezoelectric body 14B. This causes an increase in volume fractions contributing to the piezoelectric performance in the first piezoelectric body 14A and the second piezoelectric body 14B, thereby further improving the piezoelectric performance. Accordingly, the piezoelectric substrate 10A of Specific Embodiment B1 can be suitably used as a constituent member in a product which needs to conform to a three-dimensional plane, for example, a wearable product (such as a piezoelectric woven fabric, a piezoelectric knitted fabric, a piezoelectric device, a force sensor, or a device for obtaining biological information, to be described later).

Specific Embodiment B2

The piezoelectric substrate of Specific Embodiment B2 has the same configuration as the piezoelectric substrate 10A of Specific Embodiment B1, except for including a fiber instead of the second piezoelectric body 14B in the piezoelectric substrate 10A of Specific Embodiment B1 shown in FIG. 2. In other words, the piezoelectric substrate of Specific Embodiment B2 includes the first piezoelectric body and the fiber, and does not include a core material, wherein the first piezoelectric body and the fiber are alternately crossed with each other to be formed into a braided structure. The fiber in Specific Embodiment B2 is a fiber which does not have piezoelectricity. In the case of this embodiment, the winding direction of the fiber may be right-handed or left-handed.

In Specific Embodiment B2, when the piezoelectric substrate is bent and deformed, the state in which the first piezoelectric body is wound in one direction with respect to the helical axis is more easily retained. This facilitates the occurrence of polarization in the helical chiral polymer (A) included in the first piezoelectric body, when a tensile force is applied in the length direction of the piezoelectric substrate.

Further, the piezoelectric substrate of Specific Embodiment B2 has an excellent bendability and flexibility, due to having a braided structure with no core material.

The above described arrangements allow the piezoelectric substrate of Specific Embodiment B2 to also have an excellent piezoelectric sensitivity, an excellent piezoelectric output stability, and an improved resistance to a load such as repeated bending or to deformation.

Next, materials and the like included in the piezoelectric substrate according to the first embodiment will be described.

<First Piezoelectric Body>

The piezoelectric substrate according to the first embodiment includes a first piezoelectric body having an elongated shape.

The first piezoelectric body is a piezoelectric body including a helical chiral polymer (A) having an optical activity.

(Helical Chiral Polymer (A))

The first piezoelectric body in the first embodiment includes a helical chiral polymer (A) having an optical activity.

The "helical chiral polymer (A) having an optical activity" as used herein refers to a polymer having a molecular structure in the form of a helix and having a molecular optical activity.

Examples of the helical chiral polymer (A) include polypeptides, cellulose derivatives, polylactic acid polymers, polypropylene oxide, and poly(β-hydroxybutyric acid).

Examples of the polypeptide include poly(γ-benzyl glutarate), and poly(γ-methyl glutarate).

Examples of the cellulose derivative include cellulose acetate, and cyanoethyl cellulose.

The helical chiral polymer (A) preferably has an optical purity of 95.00% ee or more, more preferably 96.00% ee or more, still more preferably 99.00% ee or more, and further still more preferably 99.99% ee or more, from the viewpoint of improving the piezoelectricity of the first piezoelectric body. The optical purity of the helical chiral polymer (A) is desirably 100.00% ee. When the optical purity of the helical chiral polymer (A) is within the above range, packing of polymer crystals exhibiting piezoelectricity becomes denser, resulting in an enhanced piezoelectricity.

The optical purity of the helical chiral polymer (A) as used herein refers to a value calculated by the following Equation:

Optical purity (% ee)=100×|amount of $L$-form−amount of $D$-form|/(amount of $L$-form+amount of $D$-form)

In other words, the optical purity of the helical chiral polymer (A) is defined as: {a numerical value obtained by dividing "the difference (absolute value) between the amount of L-form [% by mass] of the helical chiral polymer (A) and the amount of D-form [% by mass] of the helical chiral polymer (A)" by "the total amount of the amount of L-form [% by mass] of the helical chiral polymer (A) and the amount of D-form [% by mass] of the helical chiral polymer (A)"}, multiplied by {100}.

As the values of the amount of L-form [% by mass] of the helical chiral polymer (A) and the amount of D-form [% by mass] of the helical chiral polymer (A), values obtained by a method using high performance liquid chromatography (HPLC) are used. Specific details of the measurement will be described later.

The helical chiral polymer (A) is preferably a polymer having a main chain including a repeating unit represented by the following Formula (1), from the viewpoint of increasing the optical purity and improving the piezoelectricity.

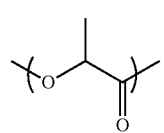

(1)

Examples of the polymer having a main chain including a repeating unit represented by the following Formula (1) include a polylactic acid polymer.

The "polylactic acid polymer" as used herein refers to "polylactic acid (a polymer consisting of repeating units derived from a monomer selected from L-lactic acid or D-lactic acid)", a "copolymer of L-lactic acid or D-lactic acid and a compound copolymerizable with the L-lactic acid or the D-lactic acid", or a mixture of both.

Among the polylactic acid polymers, polylactic acid is preferred, and a homopolymer of L-lactic acid (PLLA, also simply referred to as "L-form") or a homopolymer of D-lactic acid (PDLA, also simply referred to as "D-form") is most preferred.

Polylactic acid is a polymer having a long chain structure formed by polymerization of lactic acid via ester bonds.

It is known that polylactic acid can be formed by: a lactide method in which lactide is produced as an intermediate; a direct polymerization method in which lactic acid is heated in a solvent under reduced pressure, followed by polymerization while removing water; or the like.

Examples of the polylactic acid include: a homopolymer of L-lactic acid; a homopolymer of D-lactic acid; a block copolymer containing a polymer of at least one of L-lactic acid or D-lactic acid; and a graft copolymer containing a polymer of at least one of L-lactic acid or D-lactic acid.

Examples of the "compound copolymerizable with L-lactic acid or D-lactic acid" include: hydroxycarboxylic acids such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; cyclic esters such as glycolide, β-methyl-δ-valerolactone, γ-valerolactone, and ε-caprolactone; polyvalent carboxylic acids such as oxalic acid, malonic acid, succinic acid, glutaric acid, adipic acid, pimelic acid, azelaic acid, sebacic acid, undecanedioic acid, dodecanedioic acid, and terephthalic acid, and anhydrides thereof; polyhydric alcohols such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, and 1,4-hexanedimethanol; polysaccharides such as cellulose; and aminocarboxylic acids such as α-amino acid.

Examples of the "copolymer of L-lactic acid or D-lactic acid and a compound copolymerizable with the L-lactic acid or the D-lactic acid" include block copolymers and graft copolymers having a polylactic acid sequence capable of forming a helical crystal.

Further, the concentration of a structure derived from a copolymer component in the helical chiral polymer (A) is preferably 20 mol % or less.

For example, in a case in which the helical chiral polymer (A) is a polylactic acid polymer, the concentration of the structure derived from the copolymer component is preferably 20 mol % or less, with respect to the total number of moles of a structure derived from lactic acid and the structure derived from the compound (copolymer component) copolymerizable with lactic acid, in the polylactic acid polymer.

The polylactic acid polymer can be produced, for example, by: the method disclosed in JP-A No. 59-096123 or JP-A No. 7-033861, in which lactic acid is directly subjected to dehydration condensation; the method disclosed in U.S. Pat. Nos. 2,668,182, 4,057,357, or the like, in which ring-opening polymerization is carried out using lactide, which is a cyclic dimer of lactic acid; or the like.

In order to control the optical purity of the polylactic acid polymer obtained by any of the above described production methods to 95.00% ee or more, and in the case of producing polylactic acid by the lactide method, for example, it is preferred to carry out polymerization of lactide whose optical purity has been increased to 95.00% ee or more by a crystallization operation.

—Weight Average Molecular Weight—

The helical chiral polymer (A) preferably has a weight average molecular weight (Mw) of 50,000 to one million.

When the helical chiral polymer (A) has an Mw of 50,000 or more, the first piezoelectric body has an improved mechanical strength. The Mw is preferably 100,000 or more, and more preferably 200,000 or more.

When the helical chiral polymer (A) has an Mw of one million or less, on the other hand, the moldability in the case of obtaining the first piezoelectric body by molding (such as extrusion molding or melt spinning) is improved. The Mw is preferably 800,000 or less, and more preferably 300,000 or less.

Further, the helical chiral polymer (A) preferably has a molecular weight distribution (Mw/Mn) of from 1.1 to 5, and more preferably from 1.2 to 4, from the viewpoint of improving the strength of the first piezoelectric body. The molecular weight distribution is still more preferably from 1.4 to 3.

Each of the weight average molecular weight (Mw) and the molecular weight distribution (Mw/Mn) of the helical chiral polymer (A) refers to a value measured by gel permeation chromatography (GPC). The Mn as used herein is a number average molecular weight of the helical chiral polymer (A).

An example of the method of measuring the Mw and Mw/Mn of the helical chiral polymer (A) by GPC will be shown below.

—GPC Measuring Apparatus—

GPC-100, manufactured by Waters Corporation

—Column—

SHODEX LF-804, manufactured by Showa Denko K.K.

—Preparation of Sample—

The first piezoelectric body is dissolved in a solvent (such as chloroform) at 40° C. to prepare a sample solution having a concentration of 1 mg/ml.

—Measurement Conditions—

A quantity of 0.1 ml of the sample solution prepared with a solvent [chloroform] is introduced into the column, at a temperature of 40° C., and at a flow velocity of 1 ml/min.

The concentration of the sample in the sample solution, which has been separated by the column, is measured by a differential refractometer.

A universal calibration curve is prepared using a polystyrene standard sample, to calculate the weight average molecular weight (Mw) and the molecular weight distribution (Mw/Mn) of the helical chiral polymer (A).

A commercially available polylactic acid can be used as a polylactic acid polymer, which is an example of the helical chiral polymer (A).

Examples of commercially available products thereof include: PURASORB (PD, PL), manufactured by PURAC Biomaterials; LACEA (H-100, H-400), manufactured by Mitsui Chemicals, Inc.; and INGEO (trade mark) biopolymer, manufactured by NatureWorks LLC.

In the case of using a polylactic acid polymer as the helical chiral polymer (A), and in order to control the weight average molecular weight (Mw) of the polylactic acid polymer to 50,000 or more, it is preferred that the polylactic acid polymer is produced by the lactide method or the direct polymerization method.

The first piezoelectric body in the first embodiment may include one kind of the above described helical chiral polymer (A), or two or more kinds thereof.

The content of the helical chiral polymer (A) (the total content, in cases where two or more kinds thereof are included) in the first piezoelectric body in the first embodiment is preferably 80% by mass or more with respect to the total amount of the first piezoelectric body.

(Stabilizer)

It is preferred that the first piezoelectric body in the first embodiment further includes a stabilizer (B) containing one or more functional groups selected from the group consisting of carbodiimide group, epoxy group, and isocyanate group, within one molecule, and having a weight average molecular weight of from 200 to 60,000. This allows for further improving resistance to moist heat.

As the stabilizer (B), it is possible to use the "stabilizer (B)" described in paragraphs 0039 to 0055 in WO 2013/054918.

Examples of a compound (carbodiimide compound) which contains a carbodiimide group within one molecule and which can be used as the stabilizer (B) include a monocarbodiimide compound, a polycarbodiimide compound, and a cyclic carbodiimide compound.

As the monocarbodiimide compound, dicyclohexyl carbodiimide, bis-2,6-diisopropylphenyl carbodiimide or the like can be suitably used.

As the polycarbodiimide compound, one prepared by any of various kinds of methods can be used. It is possible to use a polycarbodiimide compound prepared by a conventional method of producing a polycarbodiimide (such as the method described in U.S. Pat. No. 2,941,956, JP-B No. S47-33279, J. Org. Chem. 28, 2069 to 2075 (1963), or Chemical Review 1981, Vol. 81, No. 4, p 619 to 621). Specifically, a carbodiimide compound disclosed in JP-B No. 4084953 can also be used.

Examples of the polycarbodiimide compound include poly(4,4'-dicyclohexylmethanecarbodiimide), poly(N,N'-di-2,6-diisopropylphenylcarbodiimide), and poly(1,3,5-triisopropylphenylene-2,4-carbodiimide).

The cyclic carbodiimide compound can be synthesized according to the method described in JP-A No. 2011-256337, or the like.

The carbodiimide compound may be a commercially available product, and examples thereof include: B2756 (trade name), manufactured by Tokyo Chemical Industry Co., Ltd.; CARBODILITE LA-1 (trade name), manufactured by Nisshinbo Chemical Inc.; STABAXOL P, STABAXOL P400 and STABAXOL I (all of these are trade names) manufactured by Rhein Chemie Rheinau GmbH.

Examples of a compound (isocyanate compound) which contains an isocyanate group within one molecule and which can be used as the stabilizer (B) include 3-(triethoxysilyl) propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of a compound (epoxy compound) which contains an epoxy group within one molecule and which can be used as the stabilizer (B) include phenyl glycidyl ether, diethylene glycol diglycidyl ether, bisphenol A-diglycidyl ether, hydrogenated bisphenol A-diglycidyl ether, phenol novolac type epoxy resin, cresol novolac type epoxy resin, and epoxidized polybutadiene.

The weight average molecular weight of the stabilizer (B) is from 200 to 60,000, as described above, but more preferably from 200 to 30,000, and still more preferably from 300 to 18,000.

Having a molecular weight within the above range facilitates the movement of the stabilizer (B), and an effect of improving the resistance to moist heat will be more effectively exhibited.

It is particularly preferred that the stabilizer (B) has a weight average molecular weight of from 200 to 900. A weight average molecular weight of from 200 to 900 roughly corresponds with a number average molecular weight of from 200 to 900. Further, when the weight average molecular weight is from 200 to 900, there is a case in which the molecular weight distribution is 1.0, and in this case, the "weight average molecular weight of from 200 to 900" can be simply referred to as a "molecular weight of from 200 to 900".

In a case in which the first piezoelectric body in the first embodiment includes the stabilizer (B), the first piezoelectric body may include only one kind of the stabilizer (B), or two or more kinds thereof.

In a case in which the first piezoelectric body in the first embodiment includes the stabilizer (B), the content of the stabilizer (B) is preferably from 0.01 parts by mass to 10 parts by mass, more preferably from 0.01 parts by mass to 5 parts by mass, still more preferably from 0.1 parts by mass to 3 parts by mass, and particularly preferably from 0.5 parts by mass to 2 parts by mass, with respect to 100 parts by mass of the helical chiral polymer (A).

When the content of the stabilizer (B) is 0.01 parts by mass or more, the resistance to moist heat will be further improved.

When the content of the stabilizer (B) is 10 parts by mass or less, on the other hand, a decrease in the transparency can be further prevented.

Examples of preferred embodiments of the stabilizer (B) include an embodiment in which a stabilizer (B1) containing one or more functional groups selected from the group consisting of carbodiimide group, epoxy group, and isocyanate group, and having a number average molecular weight of from 200 to 900, and a stabilizer (B2) containing two or more of the one or more functional groups selected from the group consisting of carbodiimide group, epoxy group, and isocyanate group within one molecule, and having a number average molecular weight of from 1,000 to 60,000, are used in combination. The stabilizer (B1) having a number average molecular weight of from 200 to 900 has a weight average molecular weight of approximately from 200 to 900; that is, the values of the number average molecular weight and the weight average molecular weight of the stabilizer (B1) are roughly the same.

In the case of using the stabilizer (B1) and the stabilizer (B2) in combination, as the stabilizer, it is preferred that the stabilizer (B1) is included in a larger amount, from the viewpoint of improving the transparency.

Specifically, from the viewpoint of balancing the transparency and the resistance to moist heat, the content of the stabilizer (B2) is preferably within the range of from 10 parts by mass to 150 parts by mass, and more preferably from 50 parts by mass to 100 parts by mass, with respect to 100 parts by mass of the stabilizer (B1).

Specific examples (stabilizers B-1 to B-3) of the stabilizer (B) are shown below.

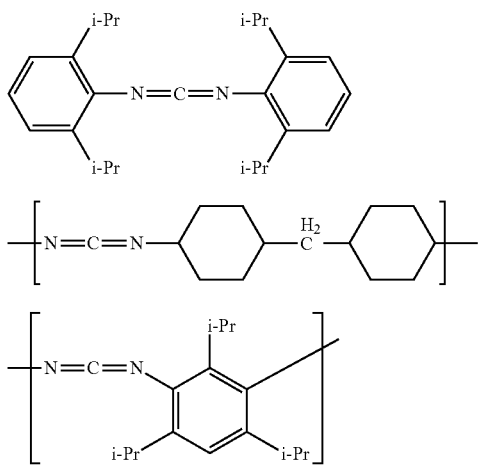

The compound names, commercially available products, and the like of the stabilizers B-1 to B-3 will be shown below.

Stabilizer B-1 The name of the compound is bis-2,6-diisopropylphenyl carbodiimide. The stabilizer B-1 has a weight average molecular weight (which means the same as "molecular weight" in this case) of 363. Examples of commercially available products thereof include "STABAXOL I" manufactured by Rhein Chemie Rheinau GmbH, and "B2756" manufactured by Tokyo Chemical Industry Co., Ltd.

Stabilizer B-2 The name of the compound is poly(4,4'-dicyclohexylmethanecarbodiimide). Examples of commercially available products thereof which have a weight average molecular weight of about 2,000 include "CARBODILITE LA-1" manufactured by Nisshinbo Chemical Inc.

Stabilizer B-3 The name of the compound is poly(1,3,5-triisopropylphenylene-2,4-carbodiimide). Examples of commercially available products thereof which have a weight average molecular weight of about 3,000 include "STABAXOL P" manufactured by Rhein Chemie Rheinau GmbH. Further, examples thereof which have a weight average molecular weight of 20,000 include "STABAXOL P400" manufactured by Rhein Chemie Rheinau GmbH.

<Other Components>

The first piezoelectric body in the first embodiment may include any of other components, if necessary.

Examples of other components include known resins such as polyvinylidene fluorides, polyethylene resins, and polystyrene resins; known inorganic fillers such as silica, hydroxyapatite, and montmorillonite; known crystal nucleating agents such as phthalocyanine; and stabilizers other than the stabilizer (B).

Examples of the inorganic filler and the crystal nucleating agent include components disclosed in paragraphs 0057 to 0058 in WO 2013/054918.

(Degree of Orientation F)

The first piezoelectric body in the first embodiment has a degree of orientation F of 0.5 or more but less than 1.0. However, the degree of orientation F is preferably 0.7 or more but less than 1.0, and more preferably 0.8 or more but less than 1.0.

When the first piezoelectric body has a degree of orientation F of 0.5 or more, molecular chains of the helical chiral polymer (A) (such as molecular chains of polylactic acid) which are aligned in the stretching direction are present in a higher number. This leads to an increased ratio of oriented crystals formed, thereby allowing the piezoelectric body to exhibit an even higher piezoelectricity.

When the first piezoelectric body has a degree of orientation F of less than 1.0, on the other hand, the piezoelectric body will have a further improved longitudinal tear strength.

(Degree of Crystallinity)

The degree of crystallinity of the first piezoelectric body in the first embodiment is a value measured by the X-ray diffraction (wide-angle x-ray diffraction measurement) described above.

The first piezoelectric body in the first embodiment preferably has a degree of crystallinity of from 20% to 80%, more preferably from 25% to 70%, and still more preferably from 30% to 60%.

When the first piezoelectric body has a degree of crystallinity of 20% or more, a high piezoelectricity can be maintained. When the first piezoelectric body has a degree of crystallinity of 80% or less, on the other hand, a high transparency is maintained in the first piezoelectric body.

For example, in a case in which a piezoelectric film to be used as a raw material of the first piezoelectric body is produced by stretching, having a degree of crystallinity of 80% or less makes the film less susceptible to whitening or rupture, thereby facilitating the production of the first piezoelectric body. Further, in a case in which a raw material (such as polylactic acid) of the first piezoelectric body is produced by melt spinning, followed by stretching, for example, having a degree of crystallinity of 80% or less enables to produce a fiber having a high bendability and flexible characteristics, thereby facilitating the production of the first piezoelectric body.

(Transparency (Internal Haze))

The first piezoelectric body in the first embodiment is not required to have transparency, in particular; however, the first piezoelectric body may, of course, have transparency.

The transparency of the first piezoelectric body can be evaluated by measuring an internal haze. The internal haze of the first piezoelectric body as used herein refers to a haze from which a haze caused by the shape of an outer surface of the first piezoelectric body is excluded.

In a case in which the first piezoelectric body is required to have transparency, the internal haze to visible light is preferably 5% or less. From the viewpoint of further improving the transparency and the longitudinal tear strength, the internal haze is more preferably 2.0% or less, and still more preferably 1.0% or less. The lower limit value of the internal haze of the first piezoelectric body may be, for example, 0.01%, but not particularly limited thereto.

The internal haze of the first piezoelectric body is a value obtained by measuring the first piezoelectric body having a thickness of from 0.03 mm to 0.05 mm, using a haze measuring apparatus [TC-H III DPK, manufactured by Tokyo Denshoku Co., Ltd.] in accordance with JIS-K7105, at 25° C.

An example of the method of measuring the internal haze of the first piezoelectric body will be shown below.

First, a sample 1 is prepared by sandwiching only a silicone oil (SHINETSU SILICONE (trademark), model number: KF96-100CS, manufactured by Shin-Etsu Chemical Co., Ltd.) between two glass plates, and the haze (hereinafter, referred to as "haze (H2)") of the sample 1 in the thickness direction is measured.

Next, a sample 2 is prepared by arranging a plurality of the first piezoelectric bodies whose surfaces are uniformly wetted with the silicone oil, without gaps, between two glass plates, and the haze (hereinafter, referred to as "haze (H3)") of the sample 2 in the thickness direction is measured.

Subsequently, the difference between these hazes is calculated according to the following Equation, to obtain the internal haze (H1) of the first piezoelectric body.

Internal haze (H1)=haze (H3)−haze (H2)

The measurements of the haze (H2) and the haze (H3) are each carried out under the following measurement conditions, and using the following apparatus.

Measuring apparatus: HAZE METER TC-H III DPK, manufactured by Tokyo Denshoku Co., Ltd.
Sample size: 30 mm width×30 mm length
Measurement conditions: in accordance with JIS-K7105
Measurement temperature: room temperature (25° C.)

(Tensile Elastic Modulus)

The first piezoelectric body preferably has a tensile elastic modulus of from 0.1 GPa to 100 GPa, and more preferably from 1 GPa to 50 GPa.

In a case in which the first piezoelectric body is obtained through a stretching step, the tensile elastic modulus refers to a tensile elastic modulus in the stretching direction (MD direction).

The first piezoelectric body may include polyvinylidene fluoride, along with the helical chiral polymer (A) (such as a polylactic acid polymer), from the viewpoint of further improving the tensile elastic modulus.

In the case of this embodiment, the first piezoelectric body preferably has a tensile elastic modulus of from 1 GPa to 10 GPa.

The method of measuring the tensile elastic modulus of the first piezoelectric body is as follows.

In a case in which the first piezoelectric body is a film (an example of an elongated flat plate form), a rectangular test specimen (film) having a length of 100 mm is prepared. A value obtained by dividing the mass (g) of the test specimen by the density (g/cc) of the material thereof is taken as the volume of the test specimen, and a value obtained by dividing the thus obtained volume by the area (product of length and width) of the main surface of the film is taken as an average thickness of the test specimen. Based on the thus obtained thickness and the width of the test specimen, a cross-sectional area of the test specimen is calculated.

An S-S curve is plotted from the amount of stress and strain when a tensile force is applied to the test specimen, using a tensile tester (TENSILON RTG1250, manufactured by A&D Co., Ltd.), and the tensile elastic modulus is calculated from a slope of initial linear strain region of the S-S curve.

In a case in which the first piezoelectric body is a thread (an example of a fibrous form), a test specimen (thread) having a length of 100 mm is prepared. A value obtained by dividing the mass (g) of the test specimen by the density (g/cc) of the material thereof is taken as the volume of the test specimen, and a value obtained by dividing the thus obtained volume by the length of the thread is taken as an average cross-sectional area of the test specimen. An S-S curve is plotted from the amount of stress and strain when a tensile force is applied to the test specimen, using a tensile tester, and the tensile elastic modulus is calculated from the slope of the initial linear strain region of the S-S curve.

(Shape and Size of First Piezoelectric Body)

The piezoelectric substrate according to the first embodiment includes the first piezoelectric body having an elongated shape.

The first piezoelectric body having an elongated shape is preferably a piezoelectric body in a fibrous form (in the form of a thread) composed of a single bundle or a plurality of bundles, or a piezoelectric body in the form of an elongated flat plate.

Descriptions will be given below in order, regarding the piezoelectric body in a fibrous form (hereinafter, also referred to as a "fibrous piezoelectric body"), and regarding the piezoelectric body in the form of an elongated flat plate (hereinafter, also referred to as an "elongated flat plate-like piezoelectric body").

—Fibrous Piezoelectric Body—

The fibrous piezoelectric body may be, for example, a monofilament thread or a multifilament thread.

Monofilament Thread

The monofilament thread preferably has a single fiber fineness of from 3 dtex to 30 dtex, and more preferably from 5 dtex to 20 dtex.

When the monofilament thread has a single fiber fineness of less than 3 dtex, it becomes difficult to handle the thread in a woven fabric preparation step or a weaving step. When the monofilament thread has a single fiber fineness exceeding 30 dtex, on the other hand, fusion bonding is more likely to occur between the threads.

In view of the cost, it is preferable to directly obtain the monofilament thread by spinning and stretching. The monofilament thread may also be one obtained commercially or otherwise.

Multifilament Thread

The multifilament thread preferably has a total fineness of from 30 dtex to 600 dtex, and more preferably from 100 dtex to 400 dtex.

As the multifilament thread, it is possible to use a one-step thread such as a spin draw thread, or alternatively, a two-step thread obtained by stretching a UDY (unstretched thread) or a POY (highly-oriented unstretched thread). The multifilament thread may also be one obtained commercially or otherwise.

Examples of commercially available products of polylactic acid monofilament threads and polylactic acid multifilament threads which can be used include: ECODEAR (registered trademark) PLA, manufactured by Toray Industries, Inc.; TERRAMAC (registered trademark), manufactured by Unitika Ltd.; and PLASTARCH (registered trademark) manufactured by Kuraray Co., Ltd.

The method of producing the fibrous piezoelectric body is not particularly limited, and the fibrous piezoelectric body can be produced by a known method.

For example, a filament thread (such as a monofilament thread or a multifilament thread) as the first piezoelectric body can be obtained by melt spinning a raw material (such as polylactic acid), followed by stretching the resultant (melt spinning drawing method). After the spinning, it is preferred to maintain the temperature of the atmosphere in the vicinity of the thread within a constant range, until the thread is cooled and solidified.

Further, the filament thread as the first piezoelectric body may be obtained, for example, by further separating the filament thread obtained by the melt spinning drawing.

Cross-Sectional Shape

The fibrous piezoelectric body can be formed to have any of various types of cross-sectional shapes, in a cross section taken in the direction vertical to the longitudinal direction of the fibrous piezoelectric body, such as for example, a cross-sectional shape in the form of a circle, an oval, a rectangle, a cocoon, a ribbon, a quatrefoil, a star, or a deformed shape.

—Elongated Flat Plate-Like Piezoelectric Body—

The elongated flat plate-like piezoelectric body may be, for example, an elongated flat plate-like piezoelectric body (such as a slit ribbon) obtained by slitting a piezoelectric film produced by a known method or a piezoelectric film obtained commercially or otherwise.

In a case in which the piezoelectric substrate according to the first embodiment includes the first piezoelectric body is in the form of an elongated flat plate, a functional layer may be provided on at least one of the main surfaces of the first piezoelectric body, to the extent that the effect of the first embodiment is not impaired.

The functional layer may have a monolayer structure, or a structure composed of two or more layers.

For example, in a case in which the functional layer is provided on both main surfaces of the elongated flat plate-like piezoelectric body, each of the functional layer provided on one of the main surfaces (hereinafter, referred to as a "top surface" for convenience) and the functional layer provided on the other main surface (hereinafter, referred to as a "back surface" for convenience) may independently have a monolayer structure or a structure composed of two or more layers.

The functional layer may be, for example, any of various kinds of functional layers.

Examples of the functional layer include an easily-adhesive layer, a hard coat layer, a refractive index controlling layer, an anti-reflection layer, an anti-glare layer, a slippery layer, an anti-blocking layer, a protective layer, an adhesive layer, an antistatic layer, a heat dissipation layer, a UV-absorbing layer, an Anti-Newton ring layer, a light scattering layer, a polarization layer, a gas barrier layer, and a hue adjustment layer.

The functional layer may be a layer composed of two or more of these layers.

The functional layer may also be a layer having two or more functions of these layers.

In a case in which the functional layer is provided on both main surfaces of the elongated flat plate-like piezoelectric body, the functional layer provided on the side of the top surface may be the same as, or different from the functional layer provided on the side of the back surface.

Further, the effects provided by the functional layer include an effect of fixing defects, for example, an effect of filling die lines and dents, on the surface of the elongated flat plate-like piezoelectric body, thereby improving the appearance. In this case, a lower difference in refractive index between the elongated flat plate-like piezoelectric body and the functional layer results in a lower reflection at the interface of the elongated flat plate-like piezoelectric body and the functional layer, thereby further improving the appearance.

The functional layer preferably includes at least one of the easily-adhesive layer, the hard coat layer, the antistatic layer, the anti-blocking layer, or the protective layer. This facilitates the application of the piezoelectric substrate to a piezoelectric device (such as a piezoelectric woven fabric or a piezoelectric knitted fabric), a force sensor, an actuator, or a device for obtaining biological information.

In a case in which the piezoelectric substrate according to the first embodiment includes the first piezoelectric body in the form of an elongated flat plate, an electrode layer may be provided on at least one (preferably both) of the main surfaces of the first piezoelectric body.

The electrode layer may be provided in contact with the elongated flat plate-like piezoelectric body, or provided with the functional layer interposed therebetween.

In a case in which the piezoelectric substrate according to the first embodiment which includes the elongated flat plate-like piezoelectric body in the above described arrangement, is used as one of the components of, for example, a piezoelectric device (such as a piezoelectric woven fabric or a piezoelectric knitted fabric), a force sensor, an actuator, or a device for obtaining biological information, it is possible, for example, to more easily connect an extraction electrode for extracting the electric charge generated in the piezoelectric substrate, with a laminated body. As a result, the productivity of the resulting piezoelectric device (such as the piezoelectric woven fabric or the piezoelectric knitted fabric), the force sensor, the actuator, or the device for obtaining biological information will be improved.

Materials for the functional layer are not particularly limited, and examples thereof include: inorganic substances such as metals and metal oxides; organic substances such as resins; and composite compositions containing a resin(s) and fine particles. As the resin, it is possible to use, for example, a cured product obtained by curing a resin, by controlling the temperature or using an active energy ray. In other words, a curable resin can be used as the resin.

Examples of the curable resin include at least one material (curable resin) selected from the group consisting of: acrylic compounds, methacrylic compounds, vinyl compounds, allyl compounds, urethane compounds, epoxy compounds, epoxide compounds, glycidyl compounds, oxetane compounds, melamine compounds, cellulose compounds, ester compounds, silane compounds, silicone compounds, siloxane compounds, silica-acrylic hybrid compounds, and silica-epoxy hybrid compounds.

Among these, an acrylic compound, an epoxy compound, or a silane compound is more preferred.

The metal may be, for example, at least one selected from Al, Si, Ti, V, Cr, Fe, Co, Ni, Cu, Zn, In, Sn, W, Ag, Au, Pd, Pt, Sb, Ta or Zr; or an alloy thereof.

The metal oxide may be, for example, at least one of titanium oxide, zirconium oxide, zinc oxide, niobium oxide, antimony oxide, tin oxide, indium oxide, cerium oxide, aluminum oxide, silicon oxide, magnesium oxide, yttrium oxide, ytterbium oxide, or tantalum oxide; or a composite oxide thereof.

Examples of the fine particles include fine particles of metal oxides as described above; and fine particles of resins such as fluororesins, silicone resins, styrene resins, and acrylic resins. Examples also include hollow fine particles which are the above described fine particles having internal cavities.

The fine particles preferably have an average primary particle size of from 1 nm to 500 nm, more preferably from 5 nm to 300 nm, and still more preferably from 10 nm to 200 nm, from the viewpoint of improving the transparency. Having an average primary particle size of 500 nm or less prevents the scattering of a visible light, whereas having an average primary particle size of 1 nm or more prevents secondary aggregation of fine particles; therefore, an average primary particle size within this range is desirable from the viewpoint of maintaining the transparency.

The functional layer preferably has a film thickness within the range of from 0.01 μm to 10 μm, but not particularly limited thereto.

The upper limit value of the thickness is more preferably 6 μm or less, and still more preferably 3 μm or less. Further, the lower limit value thereof is more preferably 0.01 μm or more, and sill more preferably 0.02 μm or more.

In a case in which the functional layer is a multilayer film composed of a plurality of functional layers, the thickness of the functional layer refers to the thickness of the entire multilayer film. Further, the functional layer may be provided on both surfaces of the elongated flat plate-like piezoelectric body. In addition, the functional layers may have a refractive index different from each other.

The method of producing the elongated flat plate-like piezoelectric body is not particularly limited, and the elongated flat plate-like piezoelectric body can be produced by a known method.

For example, the first piezoelectric body can be produced from a piezoelectric film, by a method in which a raw material (such as polylactic acid) is formed in the form of a film to obtain an unstretched film, and the resulting unstretched film is subjected to stretching and crystallization, followed by slitting the resulting piezoelectric film.

The term "slitting" as used herein refers to cutting the piezoelectric film into an elongated shape.

Either the stretching or the crystallization may be carried out first. Further, a method may also be used in which an unstretched film is subjected to pre-crystallization, stretching, and crystallization (annealing) are carried out in this order. The stretching of the film may be carried out by uniaxial stretching or biaxial stretching. In the case of stretching the film by biaxial stretching, the draw ratio in one direction (the main stretching direction) is preferably adjusted to a higher magnification.

As to the method of producing a piezoelectric film, methods disclosed in known literature, such as JP-B No. 4934235, WO 2010/104196, WO 2013/054918, and WO 2013/089148, can be referred to, as appropriate.

<Fiber>

The piezoelectric substrate according to the first embodiment may include a fiber.

It is preferred that the fiber is wound in a direction different from the one direction (the winding direction of the first piezoelectric body), and that the first piezoelectric body and the fiber are alternately crossed with each other to be formed into a braided structure.

The winding direction (right-handed or left-handed direction) of the fiber may be the same as, or different from the winding direction of the first piezoelectric body.

The fiber is not particularly limited, and examples thereof include: polymer fibers such as aramid fibers, polyester fibers, acrylic fibers, polyethylene fibers, polypropylene fibers, vinyl chloride fibers, polysulfone fibers, polyether fibers, and polyurethane fibers; natural fibers such as cotton, hemp, silk, and cellulose; semi-synthetic fibers such as acetate; regenerated fibers such as rayon and cupra; and glass fibers. Further, the fiber may also be, for example, the second piezoelectric body in the form of a fiber.

These fibers may be used singly, or in combination of two or more kinds thereof.

The fiber may be, for example, a monofilament thread or a multifilament thread. The monofilament thread may have, for example, a single fiber fineness within the same range as the single fiber fineness of the monofilament thread in the previously described fibrous piezoelectric body. The multifilament thread may have, for example, a total fineness within the same range as the total fineness of the multifilament thread in the previously described fibrous piezoelectric body.

<Second Piezoelectric Body>

The piezoelectric substrate according to the first embodiment may include a second piezoelectric body having an elongated shape.

It is preferred that the second piezoelectric body is wound in a direction different from the one direction (the winding direction of the first piezoelectric body), and that the first piezoelectric body and the second piezoelectric body are alternately crossed with each other to be formed into a braided structure.

The second piezoelectric body preferably has the same properties as the properties of the first piezoelectric body.

In other words, it is preferred that:

the second piezoelectric body includes a helical chiral polymer (A) having an optical activity;

the length direction of the second piezoelectric body is substantially parallel to the main direction of orientation of the helical chiral polymer (A) included in the second piezoelectric body; and the second piezoelectric body has a degree of orientation F, as measured by X-ray diffraction according to the Equation (a), within the range of 0.5 or more but less than 1.0.

The second piezoelectric body preferably has other properties which are the same as the first piezoelectric body, in addition to the properties described above.

In a case in which the first piezoelectric body and the second piezoelectric body are alternately crossed with each other to be formed into a braided structure, it is preferred that the helical chiral polymer (A) included in the first piezoelectric body has a chirality different from the chirality of the helical chiral polymer (A) included in the second piezoelectric body.

Further, the second piezoelectric body may have properties different from the properties of the first piezoelectric body.

The second piezoelectric body may include the stabilizer (B) and any of other components, in the same manner as the previously described first piezoelectric body.

<Adhesive Composition>

The first piezoelectric body in the first embodiment preferably includes an adhesive composition, from the viewpoint of improving the piezoelectric sensitivity, and the piezoelectric output stability.

The term "adhesion" is used as a concept encompassing the concept of "pressure-sensitive adhesion". Further, the term "adhesive" is used as a concept encompassing the concept of "pressure-sensitive adhesive".

The adhesive composition is sometimes referred to as the "adhesive", in the description given below.

The adhesive is used in order to mechanically integrate the portions of the first piezoelectric body.

In a case in which the first piezoelectric body includes the adhesive, the relative positions of the portions of the first piezoelectric body are less likely to be displaced when a tensile force is applied to the piezoelectric substrate according to the first embodiment, making the tensile force to be more efficiently applied to the first piezoelectric body. This allows for an effective detection of a voltage output proportional to the tensile force. As a result, the piezoelectric sensitivity, and the piezoelectric output stability are further improved. Further, when the first piezoelectric body includes the adhesive, the absolute value of the amount of electric charge generated (surface potential generated) per unit tensile force, in the piezoelectric substrate, will be further increased.

In contrast, in a piezoelectric substrate in which the first piezoelectric body does not include the adhesive, flexible properties will be maintained even after being processed into a piezoelectric fiber (such as a piezoelectric knitted fabric, or a piezoelectric woven fabric) to be described later, enabling to provide a favorable feeling of fit when used in a wearable sensor or the like.

Materials shown below can be used as the materials for the adhesive composition (adhesive).

Examples of materials which can be used include: epoxy adhesives, urethane adhesives, vinyl acetate resin emulsion adhesives, (EVA) emulsion adhesives, acrylic resin emulsion adhesives, styrene-butadiene rubber latex adhesives, silicone resin adhesives, α-olefin (isobutene-maleic anhydride resin) adhesives, vinyl chloride resin solvent adhesives, rubber adhesives, elastic adhesives, chloroprene rubber solvent adhesives, nitrile rubber solvent adhesives, and cyanoacrylate adhesives.

—Thickness—

The thickness of portions bonded with the adhesive in the first embodiment is "the thinner the better", as long as no gap is formed between the objects or portions to be bonded, and the strength of the bonding is not decreased. When the thickness of the bonded portions is decreased, the strain generated by the tensile force applied to the piezoelectric substrate becomes less likely to be alleviated at the portions of the adhesive, thereby efficiently decreasing the strain in the first piezoelectric body. As a result, in a case in which the piezoelectric substrate according to the first embodiment is used, for example, in a sensor, the sensitivity of the resulting sensor will be improved.

—Method of Coating Adhesive—

The method of coating the adhesive is not particularly limited, and it is possible to use, mainly, the following two methods.

Method in which Adhesive is Disposed After Processing, Followed by Bonding

Examples of this method include a method in which: the first piezoelectric body is disposed; in a case in which the piezoelectric substrate includes a fiber, the fiber and the first piezoelectric body are disposed; in a case in which the piezoelectric substrate includes an electrode, the electrode is processed and disposed; and after completing the disposition of respective members to be included in the substrate, in addition to the above dispositions, the adhesive is disposed between the portions of the respective members (for example, between the portions of the first piezoelectric body), and at the interfaces between the respective members and the like, by a technique such as coating, e.g. dip coating, or impregnation, so that the respective portions and members are adhered with each other.

Method in which Uncured Adhesive is Disposed before Processing, and Bonded after Processing Examples of this method include a method in which: a photocurable adhesive, a thermosetting adhesive, a thermoplastic adhesive, or the like is coated on a surface of the first piezoelectric body using a gravure coater, a dip coater, or the like, in advance, followed by drying, and then, for example, the first piezoelectric body is disposed; in a case in which the piezoelectric substrate includes a fiber, the fiber and the first piezoelectric body are disposed; in a case in which the piezoelectric substrate includes an electrode, the electrode is processed and disposed; and after completing the disposition of respective members to be included in the substrate, in addition to the above dispositions, the adhesive is cured by UV irradiation or heating, so that the portions of the respective members, and the interfaces between the respective members, and the like are bonded with each other.

Further, in a case in which the piezoelectric substrate according to the first embodiment is processed into a piezoelectric knitted fabric or a piezoelectric woven fabric to be described later, the portions of the respective members (such as the portions of the first piezoelectric body), the interfaces between the respective members, and the like, for example, may be bonded or heat fused with each other, in the same manner as described above, after being processed into the piezoelectric knitted fabric or the piezoelectric woven fabric. In this case, the piezoelectric knitted fabric or the piezoelectric woven fabric can be processed easily, since the knitted fabric or the woven fabric maintains flexible properties before the respective members or the portions thereof are integrated by the adhesive.

The above method is characterized in that: it allows for processing by a dry process, after the adhesive has been coated and dried, thereby facilitating the processing; and that it enables to easily form a coating film having a uniform thickness, thereby reducing a variation in sensor sensitivity etc.

<Method of Producing Piezoelectric Substrate>

The method of producing the piezoelectric substrate according to the first embodiment is not particularly limited, and the piezoelectric substrate can be produced, for example, by preparing the first piezoelectric body, and helically winding the first piezoelectric body in one direction with respect to the helical axis.

Further, the piezoelectric substrate according to the first embodiment can also be prepared, for example, by using a fiber which is soluble by a specific action (such as a thread soluble in water), and helically winding the first piezoelectric body around the fiber in one direction, followed by allowing the fiber to dissolve over time, or dissolving and removing the fiber with water, as described above. Further, the piezoelectric substrate can also be produced by helically winding the first piezoelectric body around a core material in one direction, followed by removing the core material.

The first piezoelectric body may be one produced by a known method, or one obtained commercially or otherwise.

In a case in which the piezoelectric substrate according to the first embodiment includes a fiber, and the first piezoelectric body and the fiber are formed into a braided structure, the piezoelectric substrate can be produced by alternately crossing and winding the first piezoelectric body and the fiber, in accordance with the method of winding the first piezoelectric body.

Further, in a case in which the piezoelectric substrate according to the first embodiment includes a second piezoelectric body, and the first piezoelectric body and the second piezoelectric body are formed into a braided structure, the piezoelectric substrate can be produced by alternately crossing and winding the first piezoelectric body and the second piezoelectric body in the same manner, in accordance with the method of winding the first piezoelectric body.

Still further, in a case in which the piezoelectric substrate according to the first embodiment includes an electrode, the piezoelectric substrate can be produced by disposing the electrode by a known method.

It is to be noted that, preferably, the adhesive is used to bind between the portions of the first piezoelectric body, and if necessary, between the fiber and the first piezoelectric body, between the first piezoelectric body and the second piezoelectric body, and between the respective members included in the piezoelectric substrate according to the first embodiment, for example, by any of the previously described methods.

The second embodiment of the piezoelectric substrate according to the present disclosure will now be described in detail.

[Piezoelectric Substrate according to Second Embodiment]

The piezoelectric substrate according to the second embodiment includes:

a core material having an elongated shape; and a first piezoelectric body having an elongated shape and helically wound in one direction with respect to the core material, wherein the core material is a non-electrically conductive core material, wherein the first piezoelectric body includes a helical chiral polymer (A) having an optical activity, wherein the length direction of the first piezoelectric body is substantially parallel to the main direction of orientation of the helical chiral polymer (A) included in the first piezoelectric body, and wherein the first piezoelectric body has a degree of orientation F, as measured by X-ray diffraction according to the following Equation (a), within the range of 0.5 or more but less than 1.0.

$$\text{Degree of orientation } F=(180°-\alpha)/180° \tag{a}$$

In the Equation (a), $\alpha$ represents the half-value width of the peak derived from the orientation. The unit of $\alpha$ is "° (degree(s))".

The piezoelectric substrate according to the second embodiment differs from the piezoelectric substrate according to the first embodiment, in that it includes a core material which is not electrically conductive (non-electrically conductive core material), and that the first piezoelectric body is helically wound around the non-electrically conductive core material in one direction.

Being "non-electrically conductive" refers to having a volume resistivity of $10^8$ $\Omega \cdot$cm or more.

The expression "the first piezoelectric body helically wound in one direction with respect to the core material" means that the first piezoelectric body is helically wound in one direction, along an outer peripheral surface of the core material.

The definitions of the "degree of orientation F" and the "one direction" are the same as described above.

By having the above configuration, the piezoelectric substrate according to the second embodiment has an excellent piezoelectric sensitivity, an excellent piezoelectric output stability, and an improved resistance to a load such as repeated bending or to deformation.

The piezoelectric substrate according to the second embodiment has piezoelectricity, due to the same reason as described for the piezoelectric substrate according to the first embodiment.

Further, in the piezoelectric substrate according to the second embodiment, the disposition of the first piezoelectric body in the above described arrangement allows a shear force to be applied to the helical chiral polymer (A), when a tensile force (stress) is applied in the length direction of the piezoelectric substrate. As a result, the polarization of the helical chiral polymer (A) occurs in the radial direction of the piezoelectric substrate. In a case in which the helically wound, first piezoelectric body is regarded as an aggregate of micro-regions which can be roughly considered as a plain in the length direction of the piezoelectric body, and when the shear force generated due to the tensile force (stress) in the plain composed of the micro-regions is applied to the helical chiral polymer, the direction of the polarization roughly matches the direction of the electric field generated due to the piezoelectric stress constant $d_{14}$.

Specifically, in the case of polylactic acid, such as, for example, in the case of a homopolymer of an L-lactic acid (PLLA) having a molecular structure in the form of a left-handed helix, when the first piezoelectric body in which the main direction of orientation of PLLA is substantially parallel to the length direction of the piezoelectric body is helically wound in the left-handed direction with respect to a non-electrically conductive core material to obtain a structure, and when a tensile force (stress) is applied to the structure, an outward electric field (polarization) is generated in the direction parallel to the radial direction, from the center of the circle of the circular cross section vertical to the tensile force. Conversely, when the first piezoelectric body in which the main direction of orientation of PLLA is substantially parallel to the length direction of the piezoelectric body is helically wound in the right-handed direction with respect to a non-electrically conductive core material to obtain a structure, and when a tensile force (stress) is applied to the structure, an inward electric field (polarization) is generated in the direction parallel to the radial direction, from the outer periphery of the circle of the circular cross section vertical to the tensile force.

Further, for example, in the case of homopolymer of a D-lactic acid (PDLA) having a molecular structure in the form of a right-handed helix, when the first piezoelectric body in which the main direction of orientation of PDLA is substantially parallel to the length direction of the piezoelectric body is helically wound in the left-handed direction with respect to a non-electrically conductive core material to obtain a structure, and when a tensile force (stress) is applied to the structure, an inward electric field (polarization) is generated in the direction parallel to the radial direction, from the outer periphery of the circle of the circular cross section vertical to the tensile force. Conversely, when the first piezoelectric body in which the main direction of orientation of PDLA is substantially parallel to the length direction of the piezoelectric body is helically wound in the right-handed direction with respect to a non-electrically conductive core material to obtain a structure, and when a tensile force (stress) is applied to the structure, an outward electric field (polarization) is generated in the direction parallel to the radial direction, from the center of the circle of the circular cross section vertical to the tensile force.

As a result, when a tensile force is applied in the length direction of the piezoelectric substrate, a potential difference proportional to the tensile force is generated at respective portions of the helically disposed first piezoelectric body, in a phase matched manner, and this is thought to allow for an effective detection of a voltage signal proportional to the tensile force.

Therefore, the piezoelectric substrate according to the second embodiment has an excellent piezoelectric sensitivity as well as excellent piezoelectric output stability.

Further, the piezoelectric substrate according to the second embodiment includes a non-electrically conductive core material as a core material, and has a structure in which the first piezoelectric body is helically wound around the non-electrically conductive core material in one direction.

Here, a piezoelectric substrate including an electrically conductive core material as the core material can also be considered. However, in such a piezoelectric substrate, the metal conductor portion of the electrically conductive core material tends to be susceptible to breakage due to fatigue, as a result of the application of a load, such as repeated bending.

Accordingly, the piezoelectric substrate according to the second embodiment has an improved resistance to a load such as repeated bending or to deformation, as compared to the piezoelectric substrate including the electrically conductive core material.

The embodiment in which the first piezoelectric body is helically wound in one direction with respect to the non-electrically conductive core material is not particularly limited. Examples thereof include: an embodiment in which the first piezoelectric body is helically wound in one direction at a predetermined helix angle, from one end to the other, along the outer peripheral surface of the non-electrically conductive core material; and an embodiment in which the non-electrically conductive core material and the first piezoelectric body are twisted with each other around the same pivot axis.

Specific embodiments of the piezoelectric substrate according to the second embodiment will now be described.

Specific Embodiment C of the piezoelectric substrate according to the second embodiment will be described below, with reference to the drawings. In the description given below, the repetition of the description given in Specific Embodiment A will be omitted.

In the piezoelectric substrate of Specific Embodiment C, the first piezoelectric body is helically wound in one direction with respect to a non-electrically conductive core material at a predetermined helix angle, from one end to the other.

Specific Embodiment C

Figure 3:
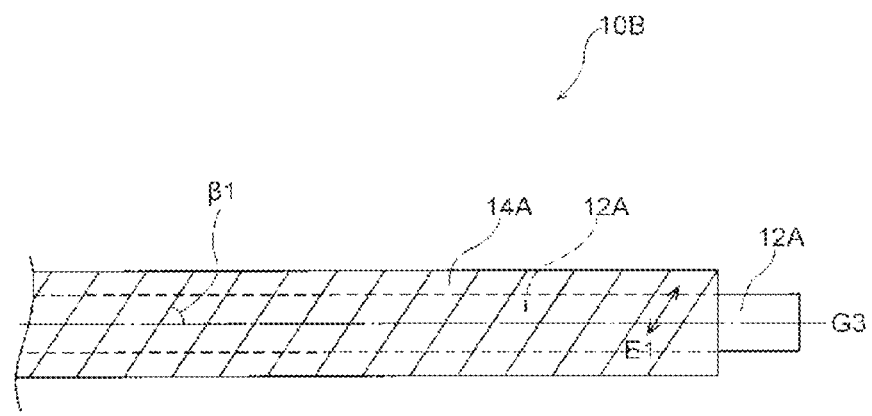
FIG. 3 is a side view showing Specific Embodiment C of a piezoelectric substrate according to a second embodiment.

FIG. 3 is a side view showing Specific Embodiment C of the piezoelectric substrate according to the second embodiment.

A piezoelectric substrate 10B of Specific Embodiment C differs from the piezoelectric substrate 10 of Specific Embodiment A in the first embodiment, in that the piezoelectric substrate 10B includes a non-electrically conductive core material 12A in the interior of the piezoelectric substrate.

In other words, the piezoelectric substrate 10B of Specific Embodiment C includes the non-electrically conductive core material 12A, and the first piezoelectric body 14A having an elongated shape.

The first piezoelectric body 14A is helically wound in one direction with respect to the non-electrically conductive core material 12A at the helix angle β1, from one end to the other, such that no gap is formed.

The "helix angle β1" refers to the angle formed between the axial direction of the non-electrically conductive core material 12A, namely, a helical axis G3, and the arrangement direction of the first piezoelectric body 14A with respect to the helical axis G3.

The piezoelectric substrate 10B of Specific Embodiment C allows for an effective detection of a voltage signal proportional to the applied tensile force, due to the same reason as described in Specific Embodiment A.

Further, in the piezoelectric substrate 10B, since the first piezoelectric body 14A is impregnated with an adhesive (not shown in the figure), in the same manner as in the piezoelectric substrate 10 of Specific Embodiment A, the relative positions of the portions of the first piezoelectric body 14A are less likely to be displaced, allowing a tensile force to be more effectively applied to the first piezoelectric body 14A.

In addition, since the piezoelectric substrate 10B includes the non-electrically conductive core material 12A as a core material, breakage due to fatigue is reduced as compared to the case of including an electrically conductive core material (such as a core material made of metal).

The above described arrangements allow the piezoelectric substrate 10B of Specific Embodiment C to have an excellent piezoelectric sensitivity, an excellent piezoelectric output stability, and an improved resistance to a load such as repeated bending or to deformation.

Next, Specific Embodiments D1 and D2 of the piezoelectric substrates according to the second embodiment will be described with reference to the drawings. In the description given below, the repetition of the descriptions given in Specific Embodiments B1 and B2 will be omitted.

In each of the piezoelectric substrates of Specific Embodiments D1 and D2, the first piezoelectric body is helically wound in one direction with respect to a non-electrically conductive core material at a predetermined helix angle, from one end to the other.

Specific Embodiment D1

Figure 4:
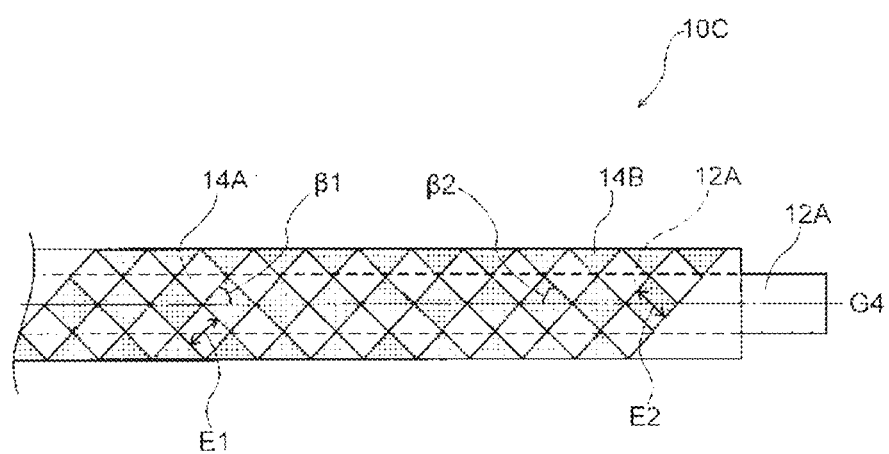
FIG. 4 is a side view showing Specific Embodiment D of the piezoelectric substrate according to the second embodiment.

FIG. 4 is a side view showing Specific Embodiment D1 of the piezoelectric substrate according to the first embodiment.

A piezoelectric substrate 10C of Specific Embodiment D1 differs from the piezoelectric substrate 10A of Specific Embodiment B1 in the first embodiment, in that the piezoelectric substrate 10C includes the non-electrically conductive core material 12A in the interior of the piezoelectric substrate.

In other words, in the piezoelectric substrate 10C of Specific Embodiment D1, the first piezoelectric body 14A and the second piezoelectric body 14B are alternately crossed with each other to be formed into a braided structure.

The piezoelectric substrate 10C of Specific Embodiment D1 allows for an effective detection of a voltage signal proportional to the applied tensile force, due to the same reason as described in Specific Embodiment B1.

Further, since the piezoelectric substrate 10C includes the non-electrically conductive core material 12A as a core material, breakage due to fatigue is reduced as compared to the case of including an electrically conductive core material (such as a core material made of metal).

The above described arrangements allow the piezoelectric substrate 10C of Specific Embodiment D1 to have an excellent piezoelectric sensitivity, an excellent piezoelectric output stability, and an improved resistance to a load such as repeated bending or to deformation.

Further, the piezoelectric substrate 10C of Specific Embodiment D1 can be suitably used as a constituent member in a product which needs to conform to a three-dimensional plane, for example, a wearable product (such as a piezoelectric woven fabric, a piezoelectric knitted fabric, a force sensor, or a device for obtaining biological information, to be described later), due to the same reason as described in Specific Embodiment B1.

Next, Specific Embodiment D2 of the piezoelectric substrate according to the second embodiment will be described with reference to the drawings. In the description given below, the repetition of the descriptions given in Specific Embodiments B1 and B2 will be omitted.

Specific Embodiment D2

The piezoelectric substrate of Specific Embodiment D2 has the same configuration as the piezoelectric substrate 10C of Specific Embodiment D1, except for including a fiber instead of the second piezoelectric body 14B, in the piezoelectric substrate 10C of Specific Embodiment D1 shown in FIG. 4. In other words, the piezoelectric substrate of Specific Embodiment D2 is a piezoelectric substrate in which the first piezoelectric body and the fiber are alternately crossed with each other to be formed into a braided structure. Further, the fiber in Specific Embodiment D2 is a fiber which does not have piezoelectricity. In the case of this embodiment, the winding direction of the fiber may be right-handed or left-handed.

In Specific Embodiment D2, when the piezoelectric substrate is bent and deformed, the state in which the first piezoelectric body is wound in one direction with respect to the non-electrically conductive core material is more easily retained, in the same manner as in Specific Embodiment B2. This facilitates the occurrence of polarization in the helical chiral polymer (A) included in the first piezoelectric body, when a tensile force is applied in the length direction of the piezoelectric substrate.

Further, since the piezoelectric substrate of Specific Embodiment D2 includes the non-electrically conductive core material as a core material, breakage due to fatigue is reduced as compared to the piezoelectric substrate including an electrically conductive core material (such as a core material made of metal).

The above described arrangements allow the piezoelectric substrate of Specific Embodiment D2 to also have an excellent piezoelectric sensitivity, an excellent piezoelectric output stability, and an improved resistance to a load such as repeated bending or to deformation Next, Specific Embodiment E of the piezoelectric substrate according to the second embodiment will be described with reference to the drawings.

Specific Embodiment E is an embodiment in which a non-electrically conductive core material and the first piezoelectric body are twisted with each other around the same pivot axis.

Specific Embodiment E

Figure 5:
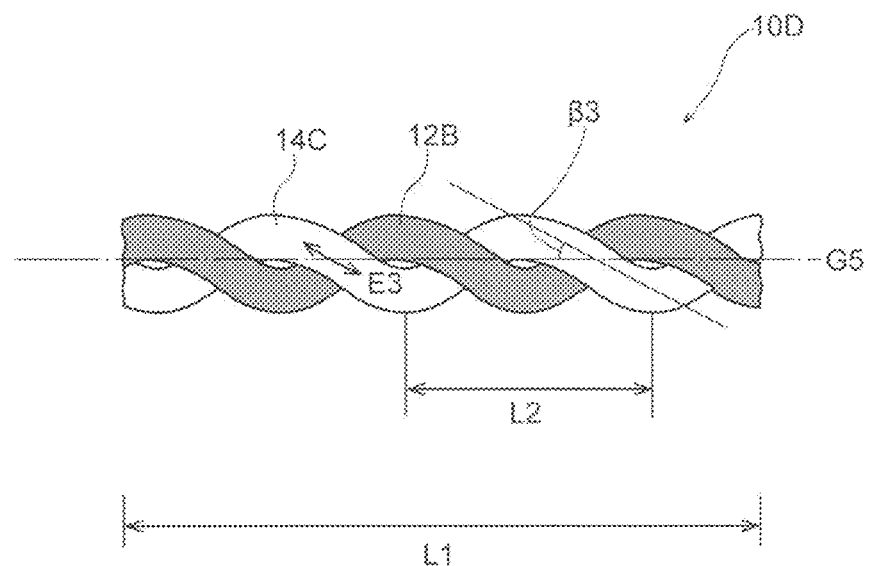
FIG. 5 is a side view showing Specific Embodiment E of the piezoelectric substrate according to the second embodiment.

FIG. 5 is a side view showing Specific Embodiment E of the piezoelectric substrate according to the second embodiment.

As shown in FIG. 5, in a piezoelectric substrate 10D according to the second embodiment, a non-electrically conductive core material 12B having an elongated shape and a first piezoelectric body 14C having an elongated shape are twisted with each other around the same pivot axis G5, at the same number of twists. More specifically, in the piezoelectric substrate 10D of Specific Embodiment E, the first piezoelectric body 14C is helically wound in the right-handed direction with respect to the pivot axis G5.

The expression "wound in the right-handed direction" as used herein means that, when the piezoelectric substrate 10D is seen from one end side of the direction of the pivot axis G5 (on the right side, in the case of FIG. 5), the first piezoelectric body 14C is wound in the right-handed direction, from the near side to the far side of the pivot axis G5.

In FIG. 5, the non-electrically conductive core material 12B and the first piezoelectric body 14C are twisted at a number of twists of "3". In this case, in FIG. 5, the number of twists per length L1 of the piezoelectric substrate 10D is "3", and the distance between the portions of the first piezoelectric body 14C per one winding is L2 (the same applies for the distance between the portions of the non-electrically conductive core material 12B). Further, in FIG. 5, the angle formed between the pivot axis G5 and the length direction of the first piezoelectric body 14C is β3.

Further, in FIG. 5, the main direction of orientation of the helical chiral polymer (A) included in the first piezoelectric body 14C is indicated by a two-way arrow E3. In other words, the main direction of orientation of the helical chiral polymer (A) is substantially parallel to the arrangement direction of the first piezoelectric body 14C.

The functions of the piezoelectric substrate 10D according to the second embodiment will be described below.

For example, when a tensile force is applied to the length direction of the piezoelectric substrate 10D, a shear force is applied to the helical chiral polymer (A) included in the first piezoelectric body 14C, and polarization occurs in the helical chiral polymer (A) included in the first piezoelectric body 14C. The polarization of the helical chiral polymer (A) occurs in the radial direction of the piezoelectric substrate 10D, and it is thought that the polarization occurs in that direction in a phase matched manner. This allows for an effective detection of a voltage signal proportional to the tensile force.

In the piezoelectric substrate 10D, in particular, the non-electrically conductive core material 12B and the first piezoelectric body 14C are merely twisted with each other. Therefore, the cross-sectional areas of the non-electrically conductive core material 12B and the first piezoelectric body 14C can be reduced, as a result of which a thinner piezoelectric substrate 10D can be obtained. Accordingly, a high bendability and flexibility (ductility) can be easily imparted to the piezoelectric substrate, making the resulting piezoelectric substrate particularly suitable for being processed into a piezoelectric woven fabric, a piezoelectric knitted fabric, or the like to be described later.

Further, since the piezoelectric substrate 10D includes the non-electrically conductive core material 12B as a core material, breakage due to fatigue is reduced as compared to the case of including an electrically conductive core material (such as a core material made of metal).

The above described arrangements allow the piezoelectric substrate 10D of Specific Embodiment E to have an excellent piezoelectric sensitivity, an excellent piezoelectric output stability, and an improved resistance to a load such as repeated bending or to deformation.

Materials and the like included in the piezoelectric substrate according to the second embodiment will be now described.

The piezoelectric substrate according to the second embodiment is in no way limited by the configuration of the piezoelectric substrate according to the first embodiment.

<Non-Electrically Conductive Core Material>

The piezoelectric substrate according to the second embodiment includes a non-electrically conductive core material having an elongated shape, as a core material.

Materials for the non-electrically conductive core material are not particularly limited, as long as the materials do not have electrical conductivity. Examples thereof include: polymer resins such as polyamide resins, polyester resins, acrylic resins, polyethylene resins, polypropylene resins, polyvinyl chloride resins, polysulfone resins, polyether resins, and polyurethane resins; cellulose resins; and inorganic materials such as glass, silica gel, and ceramics. These materials may be used singly, or in combination of two or more kinds thereof.

The shape (elongated shape) and the major axis diameter of the non-electrically conductive core material are not particularly limited. However, the non-electrically conductive core material is preferably a core material in a fibrous form composed of a single bundle or a plurality of bundles.

The core material in a fibrous form may be, for example, a thread (a monofilament thread or a multifilament thread).

<First Piezoelectric Body>

The definition and preferred embodiments of the first piezoelectric body in the second embodiment are the same as the definition and preferred embodiments of the first piezoelectric body in the first embodiment.

Further, the definition and preferred embodiments of the helical chiral polymer (A) included in the first piezoelectric body in the second embodiment are the same as the definition and preferred embodiments of the helical chiral polymer (A) included in the first piezoelectric body in the first embodiment.

<Fiber>

The piezoelectric substrate according to the second embodiment may include a fiber.

The fiber is preferably wound in a direction different from the one direction (the winding direction of the first piezoelectric body). In addition, it is preferred that the first piezoelectric body and the fiber are alternately crossed with each other to be formed into a braided structure.

The definition and preferred embodiments of the fiber in the second embodiment are the same as the definition and preferred embodiments of the fiber in the first embodiment.

<Second Piezoelectric Body>

The piezoelectric substrate according to the second embodiment may include a second piezoelectric body having an elongated shape.

The second piezoelectric body is preferably wound in a direction different from the one direction (the winding direction of the first piezoelectric body). In addition, it is preferred that the first piezoelectric body and the second piezoelectric body are alternately crossed with each other to be formed into a braided structure.

The definition and preferred embodiments of the second piezoelectric body in the second embodiment are the same as the definition and preferred embodiments of the second piezoelectric body in the first embodiment.

The second piezoelectric body in the second embodiment may include the stabilizer (B) and any of other components, in the same manner as the second piezoelectric body in the first embodiment.

<Adhesive Composition>

The first piezoelectric body in the second embodiment preferably includes an adhesive composition, from the viewpoint of improving the piezoelectric sensitivity, and the piezoelectric output stability.

The definition and preferred embodiments of the adhesive composition (adhesive) in the second embodiment are the same as the definition and preferred embodiments of the adhesive in the first embodiment. The coating method and the physical properties of the adhesive in the second embodiment are also the same as the coating method and the physical properties of the adhesive in the first embodiment.

In the coating method of the adhesive in the second embodiment, the adhesive may be disposed, for example, after completing the disposition of the core material and the first piezoelectric body, between respective members (such as between the core material and the first piezoelectric body) and at the interfaces between the respective members and the like, in accordance with the coating method of the adhesive in the first embodiment, so that the respective members are adhered (bonded) with one another.

Alternatively, the coating of the adhesive may be carried out by coating a photocurable adhesive, a thermosetting adhesive, a thermoplastic adhesive or the like on the surface of the first piezoelectric body by a gravure coater, a dip coater, or the like, in advance, followed by drying, and after completing the disposition of the core material and the first piezoelectric body, for example, the adhesive may be disposed between respective members (such as between the core material and the first piezoelectric body) and at the interfaces between the respective members and the like, so that the respective members are adhered (bonded) with one another.

In a case in which the non-electrically conductive core material and the first piezoelectric body, in the piezoelectric substrate according to the second embodiment, are twisted with each other (for example, in the case of Specific Embodiment E), the manner in which the core material and the first piezoelectric body are twisted with each other is not particularly limited. However, it is more preferred that the core material and the first piezoelectric body are twisted with each other around the same pivot axis and at the same number of twists.

The number of twists per 1 m of the non-electrically conductive core material and the first piezoelectric body varies depending on an outer diameter (thickness) of the non-electrically conductive core material and an outer diameter (thickness) of the first piezoelectric body. For example, in a case in which the outer diameter of the non-electrically conductive core material and the outer diameter of the first piezoelectric body are approximately the same, the number of twists per 1 m is defined by the following Equation. The definition of the "outer diameter" is the same as the definition of the "major axis diameter of a cross section" previously described.

$$\text{Number of twists (times)} = 1000 \text{ (mm)} \times \tan \beta 3/(\pi D)$$

In the Equation, D represents the outer diameter (mm) of the non-electrically conductive core material or the first piezoelectric body;

$\pi D$ represents a circumference length of the non-electrically conductive core material or the first piezoelectric body; and $\beta 3$ represents the angle (°) formed between the pivot axis and the length direction of the first piezoelectric body.

For example, in a case in which the outer diameter of the non-electrically conductive core material and the outer diameter of the first piezoelectric body are approximately the same, the number of twists per 1 m of the non-electrically conductive core material and the first piezoelectric body is preferably represented by the Equation: $1000 \text{ (mm)} \times \tan \beta 3/(\pi D)$ (times) (wherein $\beta 3 = 45° \pm 30°$), more preferably represented by the Equation: $1000 \text{ (mm)} \times \tan \beta 3/(\pi D)$ (times) (wherein $\beta 3 = 45° \pm 25°$), still more preferably represented by the Equation: $1000 \text{ (mm)} \times \tan \beta 3/(\pi D)$ (times) (wherein ($\beta 3 = 45° \pm 20°$), and particularly preferably represented by the Equation: $1000 \text{ (mm)} \times \tan \beta 3/(\pi D)$ (times) (wherein $\beta 3 = 45° \pm 15°$), from the viewpoint of improving the piezoelectric sensitivity and the piezoelectric output stability as well as improving the resistance to a load such as repeated bending or to deformation.

This allows the non-electrically conductive core material and the first piezoelectric body to be strongly brought into close contact with each other, and to be less susceptible to breakage when twisted with each other, as a result of which the piezoelectricity and the mechanical strength can be obtained in a balanced manner.

Specifically, in a case in which the outer diameter of the non-electrically conductive core material and the outer diameter of the first piezoelectric body are approximately the same, the number of twists per 1 m of the non-electrically conductive core material and the first piezoelectric body is not particularly limited, as long as the number of twists is within the range satisfying the above Equation. For example, the number of twists is preferably from 200 to 2,000 times, more preferably from 200 to 1,500 times, still more preferably from 200 to 1,000 times, and particularly preferably from 200 to 500 times.

In a case in which the non-electrically conductive core material and the first piezoelectric body, in the piezoelectric substrate according to the second embodiment, are twisted with each other (for example, in the case of Specific Embodiment E), the first piezoelectric body is preferably in a fibrous form composed of a single bundle or a plurality of bundles.

The first piezoelectric body preferably has a major axis diameter of a cross section of from 0.0001 mm to 2 mm, more preferably from 0.001 mm to 1 mm, and still more preferably from 0.002 mm to 0.5 mm.

The definition of the "major axis diameter of a cross section" is the same as the definition of the "major axis diameter of a cross section" previously described.

<Method of Producing Piezoelectric Substrate>

The method of producing the piezoelectric substrate according to the second embodiment is not particularly limited, and the piezoelectric substrate can be produced, for example, by preparing a first piezoelectric body, and helically winding the first piezoelectric body in one direction with respect to a separately prepared non-electrically conductive core material.

In a case in which the non-electrically conductive core material and the first piezoelectric body, in the piezoelectric substrate according to the second embodiment, are twisted with each other, the piezoelectric substrate can be produced, for example, by preparing the first piezoelectric body, and twisting the first piezoelectric body and a separately prepared non-electrically conductive core material with each other, around the same pivot axis.

The first piezoelectric body may be one produced by a known method, or one obtained commercially or otherwise.

In a case in which the piezoelectric substrate according to the second embodiment includes a fiber, and the first piezoelectric body and the fiber are formed into a braided structure, the piezoelectric substrate can be produced by alternately crossing and winding the first piezoelectric body and the fiber, in accordance with the method of winding the first piezoelectric body with respect to the non-electrically conductive core material.

Further, in a case in which the piezoelectric substrate according to the second embodiment includes a second piezoelectric body, and the first piezoelectric body and the second piezoelectric body are formed into a braided structure, the piezoelectric substrate can be produced by alternately crossing and winding the first piezoelectric body and the second piezoelectric body in the same manner, in accordance with the method of winding the first piezoelectric body with respect to the non-electrically conductive core material.

Still further, in a case in which the piezoelectric substrate according to the second embodiment includes an electrode, the piezoelectric substrate can be produced by disposing the electrode by a known method.

It is to be noted that, preferably, the adhesive is used to bind between the portions of the first piezoelectric body, and if necessary, between the fiber and the first piezoelectric body, between the first piezoelectric body and the second piezoelectric body, and between the respective members included in the piezoelectric substrate according to the second embodiment, for example, by any of the previously described methods.

[Piezoelectric Woven Fabric]

A piezoelectric woven fabric according to the present embodiment includes a woven fabric structure.

The woven fabric structure is composed of warp and weft threads.

In the piezoelectric woven fabric according to the present embodiment, at least one of the warp or weft threads include the piezoelectric substrate according to the present embodiment (piezoelectric substrate according to the first embodiment or the piezoelectric substrate according to the second embodiment).

Therefore, the piezoelectric woven fabric according to the present embodiment provides the same effect as the effect provided by the piezoelectric substrate according to the present embodiment.

The term "woven fabric" as used herein generally refers to a woven fabric structure in the form of a film, obtained by crossing threads. The term "piezoelectric woven fabric" refers, among woven fabrics, to a woven fabric which exhibits a piezoelectric effect in response to an external stimulus (such as a physical force).

In the piezoelectric woven fabric according to the present embodiment, both of the warp and weft threads may include the piezoelectric substrate according to the present embodiment.

In the case of this embodiment, it is preferred that the first piezoelectric body included in the warp threads is wound in a winding direction different from the winding direction of the first piezoelectric body included in the weft threads, and the helical chiral polymer (A) included in the warp threads has the same chirality as the chirality of the helical chiral polymer (A) included in the weft threads, from the viewpoint of improving the piezoelectric sensitivity, and the piezoelectric output stability.

Alternatively, it is preferred that the first piezoelectric body included in the warp threads is wound in the same winding direction as the winding direction of the first piezoelectric body included in the weft threads, and the helical chiral polymer (A) included in the warp threads has a chirality different from the chirality of the helical chiral polymer (A) included in the weft threads.

Examples of the threads include a thread containing a polymer.

Examples of the polymer contained in the thread containing a polymer, include: common polymers such as polyester and polyolefin, and helical chiral polymers such as the previously described helical chiral polymer (A).

Further, the concept of the "thread containing a polymer" encompasses the piezoelectric substrate according to the present embodiment.

The woven fabric structure in the piezoelectric woven fabric according to the present embodiment is not particularly limited.

Examples of the woven fabric structure include basic structures such as plain weave, twill weave, and satin weave structures.

The piezoelectric substrate according to the present embodiment may be used as warp threads or as weft threads in the piezoelectric woven fabric, or alternatively, as some of the warp threads or some of the weft threads.

The piezoelectric woven fabric according to the present embodiment may be a woven fabric having a three-dimensional structure. The woven fabric having a three-dimensional structure refers to a woven fabric formed into a three-dimensional object, by additionally weaving threads (warp and weft threads) in the thickness direction of a woven fabric having a two-dimensional structure.

Examples of the woven fabric having a three-dimensional structure are disclosed, for example, in JP-A No. 2001-513855.

The piezoelectric woven fabric according to the present embodiment is not limited, as long as the piezoelectric substrate according to the present embodiment is used as at least some of the threads constituting the woven fabric structure.

[Piezoelectric Knitted Fabric]

A piezoelectric knitted fabric according to the present embodiment includes a knitted fabric structure. The knitted fabric structure includes the piezoelectric substrate according to the present embodiment.

Accordingly, the piezoelectric knitted fabric according to the present provides the same effect as the effect provided by the piezoelectric substrate according to the present embodiment.

The term "knitted fabric" as used herein generally refers to a knitted fabric obtained by knitting threads while making loops therewith. The term "piezoelectric knitted fabric" refers, among knitted fabrics, to a knitted fabric which exhibits a piezoelectric effect in response to an external stimulus (such as a physical force).

Examples of the threads include a thread containing a polymer.

Examples of the polymer contained in the thread containing a polymer, include: common polymers such as polyester and polyolefin, and helical chiral polymers such as the previously described helical chiral polymer (A).

Further, the concept of the "thread containing a polymer" encompasses the piezoelectric substrate according to the present embodiment.

The knitted fabric structure in the piezoelectric knitted fabric according to the present embodiment is not particularly limited.

Examples of the knitted fabric structure include basic structures such as weft-knitted and warp-knitted structures. Examples of the weft-knitted structure include those obtained by methods such as flat knitting, rib knitting, interlock knitting, purl knitting, and circular knitting. Examples of the warp-knitted structure include basic structures obtained by methods such as tricot knitting, atlas knitting, diamond knitting, and Milanese knitting.

The piezoelectric substrate according to the present embodiment may be used as threads in the piezoelectric knitted fabric, or alternatively, as some of the threads.

The piezoelectric knitted fabric according to the present embodiment may be a knitted fabric having a three-dimensional structure. The knitted fabric having a three-dimensional structure refers to a knitted fabric formed into a three-dimensional object, by additionally weaving threads in the thickness direction of a knitted fabric having a two-dimensional structure.

The piezoelectric knitted fabric according to the present embodiment is not limited, as long as the piezoelectric substrate according to the present embodiment is used as at least some of the threads constituting the knitted fabric structure.

<Application of Piezoelectric Woven Fabric or Piezoelectric Knitted Fabric>

The piezoelectric woven fabric or the piezoelectric knitted fabric according to the present embodiment can be used in any application which requires piezoelectricity in at least one part thereof.

Specific examples of applications of the piezoelectric woven fabric or the piezoelectric knitted fabric according to the present embodiment include various types of clothing (shirts, suits, blazers, blouses, coats, jackets, blousons, jackets, vests, one-piece dresses, trousers, skirts, pants, underwear (slips, petticoats, camisoles, and brassieres), socks, gloves, kimonos, obi materials, gold brocades, cool touch clothing, ties, handkerchiefs, mufflers, scarves, stoles, and eye masks), table clothes, footwear (sneakers, boots, sandals, pumps, mules, slippers, ballet shoes, and kung fu shoes), towels, pouches, bags (tote bags, shoulder bags, handbags, pochettes, shopping bags, eco bags, rucksacks, daypacks, sports bags, travelling bags, waist bags, waist pouches, second bags, clutch bags, vanity bags, accessory pouches, mother's bags, party bags, and kimono bags), pouches and cases (cosmetic pouches, tissue cases, spectacle cases, pen cases, book covers, pouches for gaming devices, key cases, and pass cases), wallets, caps and hats (hats, caps, caskets, flat caps, ten-gallon hats, floppy hats, sun visors, and berets), helmets, hoods, belts, aprons, ribbons, corsages, broaches, curtains, wall clothes, seat covers, sheets, comforters, comforter covers, blankets, pillows, pillow covers, sofas, beds, baskets, various types of wrapping materials, materials for interior decoration, automobile accessories, imitation flowers, masks, bandages, ropes, various types of nets, fishing nets, cement reinforcing materials, meshes for screen printing, various types of filters (filters for automobiles, and filters for consumer electronics), various types of meshes, sheets (agricultural sheets, and picnic sheets), woven fabrics for civil engineering works, woven fabrics for construction works, and filter fabrics.

Further, the piezoelectric woven fabric or the piezoelectric knitted fabric according to the present embodiment may be used to constitute the entirety of any of the above described specific examples, or alternatively, the piezoelectric woven fabric or the piezoelectric knitted fabric according to the present embodiment may be used only for a portion(s) thereof which need(s) to have piezoelectricity.

The piezoelectric woven fabric or the piezoelectric knitted fabric according to the present embodiment is particularly suitably used in a wearable product, which is intended to be worn on a body.

Details regarding specific embodiments of the piezoelectric knitted fabric according to the present embodiment will be described later, along with specific embodiments of the piezoelectric device.

[Piezoelectric Device]

A piezoelectric device according to the present embodiment includes the piezoelectric woven fabric according to the present embodiment or the piezoelectric knitted fabric according to the present embodiment.

In other words, the piezoelectric device according to the present embodiment includes the piezoelectric substrate according to the present embodiment or the piezoelectric woven fabric including the piezoelectric substrate according to the present embodiment, or alternatively, includes the piezoelectric substrate according to the present embodiment or the piezoelectric knitted fabric including the piezoelectric substrate according to the present embodiment.

The piezoelectric woven fabric or the piezoelectric knitted fabric preferably includes an electrode. The electrode is an electrode for detecting the electric charge generated from the piezoelectric substrate.

Electrode materials are not particularly limited, and examples thereof include metals (such as Al). Other examples include Ag, Au, Cu, Ag—Pd alloys, Ag pastes, Cu pastes, carbon black, ITO (including crystalline ITO and amorphous ITO), ZnO, IGZO, IZO (registered trademark), electrically conductive polymers (polythiophene, PEDOT), Ag nanowires, carbon nanotubes, and graphene.

Accordingly, the piezoelectric device according to the present embodiment provides the same effect as the effect provided by the piezoelectric substrate according to the present embodiment (piezoelectric substrate according to the first embodiment or the piezoelectric substrate according to the second embodiment).

The piezoelectric device according to the present embodiment preferably includes: an electrode; and an insulator provided between the electrode and the woven fabric structure or the knitted fabric structure.

This allows for obtaining a structure in which the occurrence of electrical short circuits between electrodes is more easily prevented.

<Applications of Piezoelectric Substrate>

The piezoelectric substrate according to the present embodiment (piezoelectric substrate according to the first embodiment or the piezoelectric substrate according to the second embodiment) can be used, for example, in sensor applications (force sensors such as seating sensors, ultrasonic wave sensors, impact acceleration sensors and impact sensors for use in sports goods for various types of ball games, such as rackets, golf clubs and bats, and the like); actuator applications (devices for sheet transportation, and the like); energy harvesting applications (power generation wear, power generation shoes, and the like); and health care-related applications (wearable motion sensors obtained by providing the sensor of the invention to various types of clothing, such as T shirts, sportswear, spats and socks, supporters, plaster casts, diapers, shoes, insoles for shoes, watches, and the like).

For example, the piezoelectric woven fabric, the piezoelectric knitted fabric, and the piezoelectric device previously described can be used in these applications.

Among the above described applications, the piezoelectric substrate according to the present embodiment is preferably used in sensor applications or actuator applications.

Specifically, the piezoelectric substrate according to the present embodiment is preferably used, mounted on a force sensor or on an actuator.

The method of detecting the electric charge or surface potential generated by the stress or strain in the piezoelectric substrate according to the present embodiment include a method in which a known non-contact surface potentiometer is used; and a method in which an electrode made of a known electrically conductive material is brought into proximity of the piezoelectric substrate to be electrostatically bound to the piezoelectric substrate, and potential changes of the electrode in this state is read by a voltmeter or the like. Further, it is possible to use a known extraction electrode as the electrode to be bonded. Examples of the extraction electrode include electrode parts such as connectors and crimp terminals. An electrode part can be bonded to the piezoelectric substrate by brazing such as soldering, or by using an electrically conductive bonding agent or the like.

Specific embodiments of the piezoelectric knitted fabric according to the present embodiment will be described with reference to the drawings.

Figure 6:
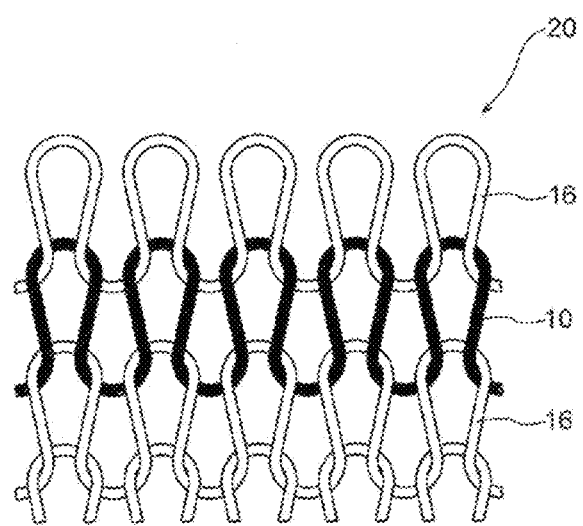
FIG. 6 is a schematic diagram showing an example of a piezoelectric knitted fabric according to a present embodiment.

FIG. 6 is a schematic diagram showing an example of the piezoelectric woven fabric according to the present embodiment.

As shown in FIG. 6, a piezoelectric knitted fabric 20 according to the present embodiment includes the piezoelectric substrate 10 and insulating threads 16, which are woven by weft knitting, and the piezoelectric substrate 10 of Specific Embodiment A is used as a part of the knitted fabric structure.

The piezoelectric substrate according to the present embodiment, the piezoelectric woven fabric according to the present embodiment, or the piezoelectric knitted fabric according to the present is also preferably used in a device for obtaining biological information.

In other words, a device for obtaining biological information according to the present embodiment includes the piezoelectric substrate according to the present embodiment, the piezoelectric woven fabric according to the present embodiment, or the piezoelectric knitted fabric according to the present embodiment.

The device for obtaining biological information according to the present embodiment is a device for detecting a biological signal(s) of a human subject or an animal subject (hereinafter, also collectively referred to as a "subject") by the piezoelectric substrate, the piezoelectric woven fabric, or the piezoelectric knitted fabric, to obtain biological information of the subject.

Examples of the biological signal as used herein include a pulse wave signal (heartbeat signals), a respiratory signal, a body motion signal, a ballistocardiographic signal, and a biological tremor.

The biological tremor refers to a rhythmical, involuntary movement of a body part (such as a finger, hand, forearm, or upper limb).

Further, the detection of the ballistocardiographic signal encompasses the detection of an effect of a force due to cardiac function of a body.

In other words, when the heart pumps blood to the aorta and pulmonary arteries, the body receives a reactive force in the direction opposite to the flow of the blood. The magnitude and the direction of the reactive force change corresponding to functional stages of the heart. The reactive force is detected by sensing the ballistocardiographic signal outside the body.

The device for obtaining biological information is provided and used in various types of commodities, such as for example, various types of clothing (shirts, suits, blazers, blouses, coats, jackets, blousons, jackets, vests, one-piece dresses, trousers, pants, underwear (slips, petticoats, camisoles, and brassieres), socks, gloves, kimonos, obi materials, gold brocades, cool touch clothing, ties, handkerchiefs, mufflers, scarves, stoles, and eye masks), supporters (neck supporters, shoulder supporters, chest supporters, abdominal supporters, back/waist supporters, arm supporters, leg supporters, elbow supporters, knee supporters, wrist supporters, and ankle supporters), footwear (sneakers, boots, sandals, pumps, mules, slippers, ballet shoes, and kung fu shoes), insoles, towels, rucksacks, caps and hats (hats, caps, caskets, flat caps, ten-gallon hats, floppy hats, sun visors, and berets), helmets, chin straps for helmets, hoods, belts, seat covers, sheets, floor cushions, cushions, comforters, comforter covers, blankets, pillows, pillow covers, sofas, chairs, desks, tables, sheets, seats, toilet seats, massage chairs, beds, bed pads, carpets, baskets, masks, bandages, ropes, various types of nets, bath tubs, flooring materials, wall materials, personal computers, computer mice, and the like.

The device for obtaining biological information is preferably provided and used in commodities onto which the weight of a subject is applied, such as, for example, footwear, insoles, sheets, floor cushions, cushions, comforters, comforter covers, pillows, pillow covers, sofas, chairs, sheets, seats, toilet seats, beds, carpets, bath tubs, flooring materials and the like.

An example of the operation of the device for obtaining biological information will be described below.

The device for obtaining biological information is provided, for example, on a bed, a seat surface of a chair, or the like. A subject lies down, sits or stands up on top of the device for obtaining biological information. When biological signals (such as body motion and periodic vibrations (pulse, respiration, and the like)) emitted from the subject in this state cause a tensile force to be applied to the piezoelectric substrate, the piezoelectric woven fabric, or the piezoelectric knitted fabric in the device for obtaining biological information, polarization occurs in the helical chiral polymer (A) included in the piezoelectric substrate, the piezoelectric woven fabric, or the piezoelectric knitted fabric, whereby a potential proportional to the tensile force is generated. The potential changes overtime corresponding to the biological signals emitted from the subject. For example, in a case in which the biological signals emitted from the subject are periodic vibrations, such as pulse and respiration, the potential generated in the piezoelectric substrate, the piezoelectric woven fabric, or the piezoelectric knitted fabric also changes periodically.

The changes overtime in the potential generated as a result of the application of the tensile force to the piezoelectric substrate, the piezoelectric woven fabric, or the piezoelectric knitted fabric are obtained as a voltage signal by a measurement module. The thus obtained changes overtime in the potential (piezoelectric signal) are obtained as a synthetic wave of a plurality of biological signals (a pulse wave signal (heartbeat signal), a respiratory signal, and a body motion signal). The synthetic wave is separated by Fourier transformation into respective frequencies to generate separate signals. Each of the thus generated separate signals is subjected to inverse Fourier transformation, to obtain respective biological signals corresponding to the respective separate signals.

For example, in a case in which the biological signals emitted from a subject are obtained as a synthetic wave of a heartbeat signal and a respiratory signal, the potential generated as a result of the application of a tensile force to the piezoelectric substrate, the piezoelectric woven fabric, or the piezoelectric knitted fabric in the device for obtaining biological information, periodically changes overtime.

In general, humans have a pulse rate of from 50 to 90 times per one minute, and a pulse frequency of from 0.6 to 3 Hz. Further, humans generally have a respiratory rate of from 16 to 18 times per one minute, and a respiratory frequency of from 0.1 to 1 Hz. Still further, the frequency of body motion in humans is 10 Hz or more, in general.

Based on such standards, a synthetic wave of a plurality of biological signals can be separated into respective biological signals. For example, the synthetic wave can be separated into a respiratory signal and a heartbeat signal. Further, it is also possible to obtain a pulse wave velocity signal from the heartbeat signal.

The separation of a synthetic wave of a plurality of biological signals into respective biological signals is carried out by the Fourier transformation and inverse Fourier transformation described above, using, for example, a biological signal notification program.

In the above described manner, a synthetic wave of a plurality of biological signals can be separated into a plurality of respective biological signals.

Further, biological signal data may be produced based on at least one of the thus separated biological signals.

The biological signal data are not particularly limited as long as the data are calculated based on the biological signals. Examples of the biological signal data include the number of biological signals per unit time, and the mean value of the number of biological signals in the past.

EXAMPLES

The present disclosure will be described more specifically by way of Examples. However, the present disclosure is in no way limited by the following Examples, as long as the gist of the invention is not deviated.

<Production of Ribbon-Like Piezoelectric Body>
(Production of Slit Ribbon 1)

To 100 parts by mass of polylactic acid (product name: INGEO (trade mark) biopolymer, brand: 4032D) manufactured by NatureWorks LLC, as the helical chiral polymer (A), 1.0 parts by mass of a stabilizer [a mixture of STABAXOL P400 (10 parts by mass) manufactured by Rhein Chemie Rheinau GmbH, STABAXOL I (70 parts by mass) manufactured by Rhein Chemie Rheinau GmbH, and CARBODILITE LA-1 (20 parts by mass) manufactured by Nisshinbo Chemical Inc.] was added, followed by dry blending, to prepare a raw material.

The thus prepared raw material was introduced into an extruder hopper and extruded from a T die while heating at 210° C. The resulting extrudate was brought into contact with a cast roll controlled to 50° C. for 0.3 minutes, to form a pre-crystallized sheet having a thickness of 150 μm (pre-crystallization step). The degree of crystallinity of the pre-crystallized sheet was measured to be 6%.

While heating the resulting pre-crystallized sheet to 70° C., the stretching of the sheet was carried out in a roll-to-roll manner at a drawing speed of 10 m/min, and the sheet was uniaxially stretched 3.5-fold in the MD direction (stretching step). The thus obtained film had a thickness of 49.2 μm.

Subsequently, the uniaxially stretched film was subjected to an annealing treatment, by bringing the film into contact with a roll heated to 145° C. for 15 seconds, in a roll-to-roll manner. Then the film was rapidly cooled to prepare a piezoelectric film (annealing treatment step).

Thereafter, the resulting piezoelectric film was slit into a width of 0.6 mm using a slitting machine, such that the direction of slitting was substantially parallel to the stretching direction of the piezoelectric film. As a result, a slit ribbon 1 having a width of 0.6 mm and a thickness of 49.2 μm was obtained, as a ribbon-like piezoelectric body. The resulting slit ribbon 1 had a cross-sectional shape in the form of a rectangle.

(Production of Slit Ribbon 2)

The stretching step was carried out in the same manner as in the production of the slit ribbon 1, except that the pre-crystallized sheet was uniaxially stretched 3.4-fold in the MD direction, to obtain a film having a thickness of 15 μm. Subsequently, the annealing treatment step was carried out in the same manner as in the production of the slit ribbon 1, to obtain a piezoelectric film.

Thereafter, the resulting piezoelectric film was slit into a width of 0.2 mm using a slitting machine, such that the direction of slitting was substantially parallel to the stretching direction of the piezoelectric film. As a result, a slit ribbon 2 having a width of 0.2 mm and a thickness of 15 μm was obtained, as the ribbon-like piezoelectric body. The resulting slit ribbon 2 had a cross-sectional shape in the form of a rectangle.

<Production of Thread-Like Piezoelectric Body>
(Production of Multifilament Thread)

Polylactic acid (melting point: 170° C., heat of fusion: 38 J/g, the molar ratio of L-lactic acid/D-lactic acid: 98.5/1.5

(content of L-lactic acid: 98.5% by mole), number average molecular weight: 85,000) was prepared as the helical chiral polymer (A).

The polylactic acid was fed to an extrusion-type melt spinning machine, and melt blended. The resultant was melt spun from a spinneret, at a spinning temperature of 225° C., and the resulting thread was cooled, and an oil was applied thereto. Thereafter, without taking up the thread once, the thread was subjected to heat stretching by being passed between hot rollers heated to 150° C., and then taken up. As a result, a multifilament thread (single-twisted multifilament) having a total fineness of 295 dtex (thread count: 20, major axis diameter: 2.7 μm) was obtained as a thread-like piezoelectric body. The "single-twisted multifilament" refers to a thread obtained by twisting a number of fibers into a single thread.

(Production of Monofilament Thread)

Polylactic acid (melting point: 170° C., heat of fusion: 38 J/g, the molar ratio of L-lactic acid/D-lactic acid: 98.5/1.5 (content of L-lactic acid: 98.5% by mole), number average molecular weight: 85,000) was prepared as the helical chiral polymer (A).

The polylactic acid was fed to an extrusion-type melt spinning machine, and melt blended. The resultant was melt extruded from a mouthpiece having a rectangular cross section, and the resulting flat thread was cooled. Thereafter, without taking up the thread once, the thread was heated to 70° C., subjected to heat stretching, further heated to 145° C., and then taken up. As a result, a monofilament thread (single-twisted monofilament) having a rectangular cross section, and having a width of 120 μm and a thickness of 30 was obtained, as the thread-like piezoelectric body.

<Measurement of Physical Properties of Ribbon-Like Piezoelectric Body and Thread-Like Piezoelectric Body>

The physical properties of each of the ribbon-like piezoelectric bodies and the thread-like piezoelectric bodies obtained as described above were carried out as follows. The results are shown in Table 1.

<Degree of Orientation F of Polylactic Acid>

Using a wide-angle x-ray diffraction apparatus (RINT 2550, manufactured by Rigaku Corporation; accessory device: rotary sample stand, X-ray source: CuKα, output: 40 kV 370 mA, detector: scintillation counter), each sample (the ribbon-like piezoelectric body or the thread-like piezoelectric body) was fixed to a holder, and an azimuthal distribution intensity of a crystal plane peak [(110) plane/ (200) plane] was measured.

From the degree of crystallinity and the half-value width (α) of the peak in the resulting azimuthal distribution curve (X-ray interference diagram), the degree of orientation F (degree of orientation of C axis) of the polylactic acid was calculated according to the following Equation, and then evaluated.

$$\text{Degree of orientation } (F) = (180° - \alpha)/180°$$

(In the Equation, α represents the half-value width of the peak derived from the orientation.)

TABLE 1

| Type of Piezoelectric body | | Material | Form | Degree of crystallinity | Degree of orientation F |
|---|---|---|---|---|---|
| Ribbon-like piezoelectric body | Slit ribbon 1 | Polylactic acid | Slit ribbon | 45% | 0.97 |
| | Slit ribbon 2 | | | 46% | 0.97 |

TABLE 1-continued

| Type of Piezoelectric body | | Material | Form | Degree of crystallinity | Degree of orientation F |
|---|---|---|---|---|---|
| Thread-like piezoelectric body | Multi-filament thread | Polylactic acid | Thread | 56% | 0.81 |
| | Mono-filament threadn | | | 57% | 0.96 |

Example 1

<Production of Piezoelectric Substrate>

A piezoelectric substrate having the same configuration as the piezoelectric substrate 10 shown in FIG. 1, namely, the piezoelectric substrate 10 including no core material, was prepared by the method shown below.

The thread-like piezoelectric body (single-twisted multifilament thread) obtained as described above was helically wound (twined) in the left-handed direction with respect to a virtual helical axis, such that the piezoelectric body was oriented in a direction of 45° with respect to the helical axis (at a helix angle of 45°), and that no gap is formed. The helical axis corresponds to the central axis of a helical structure formed with the thread-like piezoelectric body. The thread-like piezoelectric body was visually observed by a stereoscopic microscope, to confirm that the number of twists was about 10 turns per 10 mm. Accordingly, the number of twists per 1 m of the present Example was determined to be 1,000 turns (1,000 T/m). The expression "wound in the left-handed direction" means that, when the piezoelectric body is seen from one end of the helical axis (on the right side, in the case of FIG. 1), the thread-like piezoelectric body is wound from the near side to the far side in the left-handed (anti-clockwise) direction.

In the above described manner, a piezoelectric substrate of Example 1 was obtained. The thread-like piezoelectric body corresponds to the first piezoelectric body 14A shown in FIG. 1. The helical axis corresponds to G1 shown in FIG. 1.

<Evaluation>

(Surface Potential Generated Per Unit Tensile Force)

The piezoelectric substrate of Example 1 was used as a sample, and the sample was set on a tensile tester (TENSILON RTG 1250, manufactured by A&D Company, Limited) at a chuck-to-chuck distance of 50 mm.

Using the tensile tester, a tensile force was repeatedly applied to the sample, within a stress range of from 1.0 N to 2.0 N in a periodic manner and in the form of a triangular wave, and the surface potentials generated on both sides of the sample at this time were measured by a surface potentiometer (MODEL 541A-2, manufactured by TREK Inc.).

The measurement was carried out in an arrangement in which a sensor head of the surface potentiometer was disposed at a central portion between the chucks of the tensile tester, and the sensor head was brought into a proximity of 2 mm to the linear piezoelectric substrate to be measured, such that a normal line of a circular end surface of the cylinder-shaped sensor head was orthogonal to the piezoelectric substrate.

Further, the measurement sample and the chuck portion of the tensile tester were surrounded by an aluminum metal plate to be electrostatically shielded, and the aluminum metal plate and a ground electrode of the surface potentiometer were electrically connected, to carry out the measurement.

The measured surface potential difference ΔV [V] was plotted on Y axis, and the tensile force F [N] of the sample was plotted on X axis to obtain a scatter diagram, and the surface potential generated per unit tensile force was calculated from the slope of a correlation line in the scatter diagram, and taken as a voltage sensitivity (force-voltage sensitivity) with respect to the applied force (tensile force) [V/N]. The result is shown in Table 2. The value of the force-voltage sensitivity shown in Table 2 is an absolute value.

Regarding the force-voltage sensitivity, it is to be noted that the value of the amount of change in the surface potential as measured by a surface potentiometer when the tensile force was increased, in the piezoelectric substrate wound in the right-handed direction, has a positive/negative sign opposite from the sign of the corresponding value in the piezoelectric substrate wound in the left-handed direction, because of the relationship between a mechanism by which the helical chiral polymer exhibits piezoelectricity and the winding direction. Accordingly, in the present Example, the value of the force-voltage sensitivity is a negative value.

Example 2

A piezoelectric substrate having the same configuration as the piezoelectric substrate 10B shown in FIG. 3 was produced by the method shown below.

First, a meta aramid fiber, CORNEX (yarn count: 40, wire diameter: 0.12 mm, length: 200 mm, double-twisted) manufactured by Teijin Limited was prepared, as a core material.

Subsequently, the thread-like piezoelectric body (single-twisted multifilament thread) obtained as described above was helically wound around the double-twisted core material in the left-handed direction, such that the piezoelectric body was oriented in a direction of 45° (helix angle: 45°) with respect to the axial direction of the core material (helical axis direction), and that no gap was formed not to expose the core material from between the wound piezoelectric body, thereby including the core material inside the piezoelectric body. The expression "wound in the left-handed direction" means that, when the piezoelectric body is seen from one end of the axial direction of the core material (on the right side, in the case of FIG. 3), the thread-like piezoelectric body is wound from the near side to the far side of the core material in the left-handed direction. For the winding, a covering apparatus used to produce lame threads for use in decorative clothing and the like, was used.

In the above described manner, a piezoelectric substrate of Example 2 was produced, and the evaluation was carried out in the similar manner as in Example 1. However, in the evaluation, the chuck-to-chuck distance was changed as shown in Table 2. The result is shown in Table 2.

The core material corresponds to the core material 12A shown in FIG. 3. The thread-like piezoelectric body corresponds to the first piezoelectric body 14A shown in FIG. 3. The helical axis corresponds to G3 shown in FIG. 3.

Example 3

A piezoelectric substrate having the same configuration as the piezoelectric substrate of Example 2 was prepared, except that the thread-like piezoelectric body was changed to the material shown below.

A meta aramid fiber, CORNEX (yarn count: 40, wire diameter: 0.12 mm, length: 200 mm, double-twisted) manufactured by Teijin Limited was prepared, as a core material. Then the ribbon-like piezoelectric body obtained as described above (slit ribbon 1), and having a width of 0.6 mm and a thickness of 49.2 μm, was helically wound around the core material in the left-handed direction, such that the piezoelectric body was oriented in a direction of 45° (helix angle: 45°) with respect to the axial direction of the core material (helical axis direction), and that no gap was formed not to expose the core material from between the wound piezoelectric body, thereby including the core material inside the piezoelectric body.

In the above described manner, a piezoelectric substrate of Example 3 was produced, and the evaluation was carried out in the similar manner as in Example 1. However, in the evaluation, the chuck-to-chuck distance was changed as shown in Table 2. The result is shown in Table 2.

Example 4

A piezoelectric substrate was prepared in the same manner as in Example 1, except that ARON ALPHA 201 (a cyanoacrylate adhesive) manufactured by Toagosei Co., Ltd. was applied dropwise onto the thread-like piezoelectric body of the piezoelectric substrate obtained in Example 1, to be impregnated thereinto, followed by curing the ARON ALPHA 201.

In the above described manner, a piezoelectric substrate of Example 4 was produced, and the evaluation was carried out in the similar manner as in Example 1. However, in the evaluation, the chuck-to-chuck distance was changed as shown in Table 2. The result is shown in Table 2.

Example 5

A piezoelectric substrate was prepared in the same manner as in Example 2, except that ARON ALPHA 201 (a cyanoacrylate adhesive) manufactured by Toagosei Co., Ltd. was applied dropwise onto the thread-like piezoelectric body of the piezoelectric substrate obtained in Example 2, to be impregnated thereinto, followed by curing the ARON ALPHA 201.

In the above described manner, a piezoelectric substrate of Example 5 was produced, and the evaluation was carried out in the similar manner as in Example 1. However, in the evaluation, the chuck-to-chuck distance was changed as shown in Table 2. The result is shown in Table 2.

Example 6

A piezoelectric substrate was prepared in the same manner as in Example 3, except that ARON ALPHA 201 (a cyanoacrylate adhesive) manufactured by Toagosei Co., Ltd. was applied dropwise onto the ribbon-like piezoelectric body of the piezoelectric substrate obtained in Example 3, to be impregnated thereinto, followed by curing the ARON ALPHA 201.

In the above described manner, a piezoelectric substrate of Example 6 was produced, and the evaluation was carried out in the similar manner as in Example 1. However, in the evaluation, the chuck-to-chuck distance was changed as shown in Table 2. The result is shown in Table 2.

Example 7

The ribbon-like piezoelectric body obtained as described above (slit ribbon 1), and having a width of 0.6 mm and a thickness of 49.2 μm, was subjected to twisting processing in the right-handed direction at 1,540 turns (1540 T/m) per 1 m, without using any core material, to be formed into the shape of a hollow tube. In order to integrate the resulting tube, ARON ALPHA 201 (a cyanoacrylate adhesive) manufactured by Toagosei Co., Ltd. was applied dropwise on the tube to be impregnated thereinto, thereby integrating the tube. In the above described manner, a piezoelectric substrate of Example 7 was produced, and the evaluation was carried out in the similar manner as in Example 1. However, in the evaluation, the chuck-to-chuck distance was changed as shown in Table 2. The result is shown in Table 2.

In the following Example 8 to Example 11, piezoelectric substrates were prepared in accordance with the method of Example 2, using the core materials and the materials for piezoelectric bodies shown in Table 2, and based on the winding direction of the piezoelectric bodies shown in Table 2.

Example 8

First, five pieces of heat fusible Nylon fibers, ELDER (330T-102-EL94) manufactured by Toray Industries, Inc. were formed into a bundle, to be used as a core material.

Subsequently, the ribbon-like piezoelectric body obtained as described above (slit ribbon 1), and having a width of 0.6 mm and a thickness of 49.2 μm, was helically wound around the core material in the right-handed direction, such that the piezoelectric body was oriented in a direction of 45° (helix angle: 45°) with respect to the axial direction of the core material (helical axis direction), and that no gap was formed not to expose the core material from between the wound piezoelectric body, thereby including the core material inside the piezoelectric body.

Further, in order to melt the heat fusible Nylon fibers (hereinafter, also referred to as "heat fusible fibers") and to integrate the piezoelectric body by adhesion, the resultant was placed in an oven controlled to 120° C. and heated for 15 minutes, to be melt-integrated.

In the above described manner, a piezoelectric substrate of Example 8 was produced, and the evaluation was carried out in the similar manner as in Example 1. However, in the evaluation, the chuck-to-chuck distance was changed as shown in Table 2. The result is shown in Table 2.

Example 9

First, three pieces of polyester threads (multifilament threads, 40 deniers) manufactured by Toray Industries, Inc. were formed into a bundle, to be used as a core material.

Subsequently, the thread-like piezoelectric body (monofilament thread) obtained as described above, and having a width of 120 μm and a thickness of 30 was helically wound around the core material in the left-handed direction, such that the piezoelectric body was oriented in a direction of 45° (helix angle: 45°) with respect to the axial direction of the core material (helical axis direction), and that no gap was formed not to expose the core material from between the wound piezoelectric body, thereby including the core material inside the piezoelectric body.

In the above described manner, a piezoelectric substrate of Example 9 was produced, and the evaluation was carried out in the similar manner as in Example 1. However, in the evaluation, the chuck-to-chuck distance was changed as shown in Table 2. The result is shown in Table 2.

Example 10

First, three pieces of polyester threads (multifilament threads, 40 deniers) manufactured by Toray Industries, Inc. were formed into a bundle, to be used as a core material. The ribbon-like piezoelectric body obtained as described above (slit ribbon 2), and having a width of 0.2 mm and a thickness of 15 was helically wound around the core material in the left-handed direction, such that the piezoelectric body was oriented in a direction of 45° (helix angle: 45°) with respect to the axial direction of the core material (helical axis direction), and that no gap was formed not to expose the core material from between the wound piezoelectric body, thereby including the core material inside the piezoelectric body.

In the above described manner, a piezoelectric substrate of Example 10 was produced, and the evaluation was carried out in the similar manner as in Example 1. However, in the evaluation, the chuck-to-chuck distance was changed as shown in Table 2. The result is shown in Table 2.

Example 11

First, three pieces of polyester threads (multifilament threads, 40 deniers) manufactured by Toray Industries, Inc. were formed into a bundle, to be used as a core material. Subsequently, one piece of heat fusible Nylon fiber, ELDER (330T-102-EL94, 297 deniers) manufactured by Toray Industries, Inc. was helically wound around the core material, to include the core material inside the heat fusible fiber. The ribbon-like piezoelectric body obtained as described above (slit ribbon 2), and having a width of 0.2 mm and a thickness of 15 μm, was helically wound in the left-handed direction around the core material on the surface of which the heat fusible fiber had been wound, such that the piezoelectric body was oriented in a direction of 45° (helix angle: 45°) with respect to the axial direction of the core material (helical axis direction), and that no gap was formed not to expose the core material from between the wound piezoelectric body, thereby including the core material inside the piezoelectric body. Further, in order to melt the heat fusible fiber so that the piezoelectric body and the core material are adhered with each other and integrated, the resultant was placed in an oven controlled at 120° C. for 15 minutes.

In the above described manner, a piezoelectric substrate of Example 11 was produced, and the evaluation was carried out in the similar manner as in Example 1. However, in the evaluation, the chuck-to-chuck distance was changed as shown in Table 2. The result is shown in Table 2.

(Tensile Elastic Modulus of Cured Product of Adhesive)

Using the adhesive (a cyanoacrylate adhesive) used in the production of the piezoelectric substrate of Example 4, the tensile elastic modulus of a cured product of the adhesive was measured, in accordance with ASTM D-882. As a result, the measured tensile elastic modulus was 330 MPa. The measurement method was as follows.

A sheet made of water-soluble polyvinyl alcohol (PVA) was used to prepare a vat having a depth of 0.5 mm, a short side length of 30 mm, and a long side length of 80 mm. The adhesive was poured into the vat and then cured. After the curing, the sheet made of water-soluble PVC was removed by being dissolved in water, to obtain a test specimen of a cured product of the adhesive in the shape of a strip. The strip-shaped test specimen was set on a tensile tester (TENSILON RTG 1250 manufactured by A&D Company, Limited) at a chuck-to-chuck distance of 50 mm. Using the tensile tester, a tensile force was repeatedly applied to the sample, within the stress range of from 1.0 N to 2.0 N in a periodic manner in the form of a triangular wave, and the strain of the strip-shaped test specimen of the cured product of the adhesive was measured. Then the tensile elastic modulus was calculated from the measured result.

TABLE 2

| | | Piezoelectric body | | | | | Evaluation | |
|---|---|---|---|---|---|---|---|---|
| | Core material | Material | Form | Winding direction | Degree of orientation F | Adhesive | Chuck-to-chuck distance [mm] | Force-piezoelectric sensitivity [V/N] |
| Example 1 | — | Polylactic acid | Multifilament thread (yarn count: 20, single twisted × 1 piece) | Left | 0.81 | — | 50 | 0.19 |
| Example 2 | Meta-aramid fiber (yarn count: 40, double twisted × 1 piece) | Polylactic acid | Multifilament thread (yarn count: 20, single twisted × 1 piece) | Left | 0.81 | — | 70 | 0.13 |
| Example 3 | Meta-aramid fiber (yarn count: 40, double twisted × 1 piece) | Polylactic acid | Slit ribbon 1 (width: 0.6 mm, thickness: 49.2 μm) | Left | 0.97 | — | 80 | 1.4 |
| Example 4 | — | Polylactic acid | Multifilament thread (yarn count: 20, single twisted × 1 piece) | Left | 0.81 | Used (ARON ALPHA 201) | 70 | 3.5 |
| Example 5 | Meta-aramid fiber (yarn count: 40, double twisted × 1 piece) | Polylactic acid | Multifilament thread (yarn count: 20, single twisted × 1 piece) | Left | 0.81 | Used (ARON ALPHA 201) | 70 | 6.3 |
| Example 6 | Meta-aramid fiber (yarn count: 40, double twisted × 1 piece) | Polylactic acid | Slit ribbon 1 (width: 0.6 mm, thickness: 49.2 μm) | Left | 0.97 | Used (ARON ALPHA 201) | 80 | 13 |
| Example 7 | — | Polylactic acid | Slit ribbon 1 (width: 0.6 mm, thickness: 49.2 μm) | Right | 0.97 | Used (ARON ALPHA 201) | 100 | 12 |
| Example 8 | Heat fusible nylon fibers (297 denier × 5 pieces) | Polylactic acid | Slit ribbon 1 (width: 0.6 mm, thickness: 49.2 μm) | Right | 0.97 | Used (Heat fusible fibers, 5 pieces) | 100 | 7.8 |
| Example 9 | Polyester threads (40 denier × 3 pieces) | Polylactic acid | Monofilament thread (width: 120 μm, thickness: 30 μm) | Left | 0.96 | — | 100 | 1.2 |
| Example 10 | Polyester threads (40 denier × 3 pieces) | Polylactic acid | Slit ribbon 2 (width: 0.2 mm, thickness: 15 μm) | Left | 0.97 | — | 100 | 2.6 |
| Example 11 | Polyester threads (40 denier × 3 pieces) | Polylactic acid | Slit ribbon 2 (width: 0.2 mm, thickness: 15 μm) | Left | 0.97 | Used (Heat fusible fiber, 1 piece) | 100 | 4.8 |

Each of the piezoelectric substrates produced in Examples 1, 4, and 7 includes a piezoelectric body helically wound in one direction with respect to a virtual helical axis, and does not include a core material. Each of the piezoelectric substrates produced in Examples 2, 3, 5, 6, and 8 to 11 includes a core material, and a piezoelectric body helically wound in one direction with respect to the core material.

It can be seen from Table 2 that, in the piezoelectric substrates of Examples 1 to 11, surface potentials were generated by the application of a tensile force thereto, and each of the piezoelectric substrates has a favorable "force-voltage sensitivity", namely, has piezoelectricity.

This is thought to be because, since the arrangement direction of the piezoelectric body (the length direction of the piezoelectric body) with respect to the helical axis is substantially parallel to the main direction of orientation of the helical chiral polymer (A), in each of the piezoelectric substrates of Examples 1 to 11, polarization was effectively generated in the helical chiral polymer (A) included in the piezoelectric body, by the application of a tensile force to the piezoelectric substrate.

In particular, the above results have revealed that the piezoelectric substrates of Examples 4 to 6, in which the piezoelectric bodies were impregnated with an adhesive, have a higher "force-voltage sensitivity" as compared to the piezoelectric substrates of Examples 1 to 3, in which the piezoelectric bodies were not impregnated with the adhesive. This is probably because, since adjacent portions of the piezoelectric body are adhered with each other by the adhesive, in each of the piezoelectric substrates of Examples 4 to 6, the transmission of the tensile force to the piezoelectric body is facilitated, resulting in a more effective generation of polarization in the helical chiral polymer (A).

Further, the piezoelectric substrate of Example 11, in which the piezoelectric body and the core material are adhered and integrated with each other by a heat fusible fiber, has a higher "force-voltage sensitivity" as compared to the piezoelectric substrate of Example 10, in which the piezoelectric body and the core material are not adhered and integrated with each other. This is thought to be because the interposition of the adhesive prevents the displacement between the piezoelectric body and the core material, and facilitates the transmission of the tensile force applied to the piezoelectric substrate, resulting in an increase in the shear stress transmitted to the piezoelectric body.

It is to be noted that, in a piezoelectric substrate including an electrically conductive core material as a core material, the metal conductor portion of the electrically conductive core material tends to be susceptible to breakage due to fatigue, as a result of the application of a load, such as repeated bending. However, since the piezoelectric substrates of Examples 1 to 11 include no core material (Examples 1, 4, and 7), or include a non-electrically conductive core material as a core material (Examples 2, 3, 5, 6, and 8 to 11), it has been suggested that the breakage due to fatigue is reduced and the resistance to a load, such as repeated bending or to deformation, is improved in the piezoelectric substrates of Examples 1 to 11, as compared to the piezoelectric substrate including an electrically conductive core material.

The disclosure of Japanese Patent Application No. 2016-113011 filed on Jun. 6, 2016, is incorporated herein by reference in their entirety.

All publications, patent applications, and technical standards mentioned in the present specification are incorporated herein by reference to the same extent as if such individual publication, patent application, or technical standard was specifically and individually indicated to be incorporated by reference.

The invention claimed is:

1. A piezoelectric substrate comprising:
   (i) a first piezoelectric body having an elongated shape and helically wound in one direction, wherein the piezoelectric substrate does not comprise a core material; or
   (ii) a first piezoelectric body having an elongated shape and helically wound in one direction around a core material, wherein the core material is a non-electrically conductive core material having an elongated shape,
   wherein the first piezoelectric body comprises a helical chiral polymer (A) having optical activity,
   wherein a length direction of the first piezoelectric body is substantially parallel to a main direction of orientation of the helical chiral polymer (A) included in the first piezoelectric body,
   wherein the first piezoelectric body has a degree of orientation F, as measured by X-ray diffraction according to Equation (a), within a range of 0.5 or more but less than 1.0:

the degree of orientation $F=(180°-\alpha)/180°$    (a)

wherein α represents a half-value width of a peak of an orientation, and
   wherein adjacent portions of the first piezoelectric body are adhered with each other by an adhesive composition.

2. The piezoelectric substrate according to claim 1, wherein the first piezoelectric body is in a fibrous form composed of a single bundle or a plurality of bundles, and has a major axis diameter of a cross section from 0.0001 mm to 10 mm.

3. The piezoelectric substrate according to claim 1, wherein the first piezoelectric body is in a form of an elongated flat plate and has a thickness from 0.001 mm to 0.2 mm and a width from 0.1 mm to 30 mm, and wherein a ratio of the width of the first piezoelectric body to the thickness of the first piezoelectric body is 1.5 or more.

4. The piezoelectric substrate according to claim 1, further comprising a fiber wound in a different direction from the one direction of the wound first piezoelectric body,
   wherein the first piezoelectric body and the fiber are alternately crossed with each other to be formed into a braided structure.

5. The piezoelectric substrate according to claim 1, further comprising a second piezoelectric body having an elongated shape and wound in a different direction from the one direction of the wound first piezoelectric body,
   wherein the second piezoelectric body comprises a helical chiral polymer (A) having optical activity,
   wherein a length direction of the second piezoelectric body is substantially parallel to a main direction of orientation of the helical chiral polymer (A) included in the second piezoelectric body,
   wherein the second piezoelectric body has a degree of orientation F, as measured by X-ray diffraction according to Equation (a), within the range of 0.5 or more but less than 1.0,
   wherein the first piezoelectric body and the second piezoelectric body are alternately crossed with each other to be formed into a braided structure, and
   wherein the helical chiral polymer (A) included in the first piezoelectric body has a different chirality from a chirality of the helical chiral polymer (A) included in the second piezoelectric body.

6. The piezoelectric substrate according to claim 1, wherein the first piezoelectric body has a helix angle from 10° to 80°.

7. The piezoelectric substrate according to claim 1, wherein the core material and the first piezoelectric body are twisted with each other.

8. The piezoelectric substrate according to claim 7,
   wherein the first piezoelectric body is in a fibrous form composed of a single bundle or a plurality of bundles, and
   wherein the first piezoelectric body has a major axis diameter of a cross section from 0.0001 mm to 2 mm.

9. The piezoelectric substrate according to claim 1,
   wherein the first piezoelectric body comprises an adhesive composition, and
   wherein a cured product of the adhesive composition has a tensile elastic modulus, as measured in accordance with ASTM D-882, from 0.1 MPa to 10 GPa.

10. The piezoelectric substrate according to claim 1, wherein the helical chiral polymer (A) included in the first piezoelectric body is a polylactic acid polymer having a main chain comprising a repeating unit represented by Formula (1):

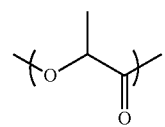

(1)

11. The piezoelectric substrate according to claim 1, wherein the helical chiral polymer (A) included in the first piezoelectric body has an optical purity of 95.00% ee or more.

12. The piezoelectric substrate according to claim 1, wherein the helical chiral polymer (A) included in the first piezoelectric body is composed of D-form or L-form.

13. The piezoelectric substrate according to claim 1, wherein α content of the helical chiral polymer (A) included in the first piezoelectric body is 80% by mass or more with respect to a total amount of the first piezoelectric body.

14. A piezoelectric woven fabric having a woven fabric structure composed of warp threads and weft threads,
   wherein at least one of the warp threads or the weft threads comprises the piezoelectric substrate according to claim 1.

15. A piezoelectric device comprising the piezoelectric woven fabric according to claim 14.

16. A piezoelectric woven fabric having a woven fabric structure composed of warp threads and weft threads,
   wherein both of the warp threads and the weft threads comprise the piezoelectric substrate according to claim 1,
   wherein the first piezoelectric body included in the warp threads is wound in a different winding direction from a winding direction of the first piezoelectric body included in the weft threads, and wherein the helical chiral polymer (A) included in the warp threads and the helical chiral polymer (A) included in the weft threads have identical chiralities.

17. A piezoelectric woven fabric having a woven fabric structure composed of warp threads and weft threads,
wherein both of the warp threads and the weft threads comprise the piezoelectric substrate according to claim 1,
wherein the first piezoelectric body included in the warp threads and the first piezoelectric body included in the weft threads have identical winding directions, and
wherein the helical chiral polymer (A) included in the warp threads has a different chirality from a chirality of the helical chiral polymer (A) included in the weft threads.

18. A piezoelectric knitted fabric having a knitted fabric structure comprising the piezoelectric substrate according to claim 1.

19. A piezoelectric device comprising the piezoelectric knitted fabric according to claim 18.

20. A force sensor comprising the piezoelectric substrate according to claim 1.

21. An actuator comprising the piezoelectric substrate according to claim 1.

* * * * *